US012595585B2

(12) United States Patent
Yokoyama et al.

(10) Patent No.: US 12,595,585 B2
(45) Date of Patent: Apr. 7, 2026

(54) HEATING PART OF SILICON SINGLE CRYSTAL MANUFACTURING DEVICE, CONVECTION PATTERN CONTROL METHOD FOR SILICON MELT, SILICON SINGLE CRYSTAL MANUFACTURING METHOD, SILICON WAFER MANUFACTURING METHOD, SILICON SINGLE CRYSTAL MANUFACTURING DEVICE, AND CONVECTION PATTERN CONTROL SYSTEM FOR SILICON MELT

(71) Applicant: SUMCO CORPORATION, Tokyo (JP)

(72) Inventors: Ryusuke Yokoyama, Tokyo (JP); Wataru Sugimura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 262 days.

(21) Appl. No.: 18/269,423

(22) PCT Filed: Nov. 5, 2021

(86) PCT No.: PCT/JP2021/040759
§ 371 (c)(1),
(2) Date: Jun. 23, 2023

(87) PCT Pub. No.: WO2022/137830
PCT Pub. Date: Jun. 30, 2022

(65) Prior Publication Data
US 2024/0060208 A1     Feb. 22, 2024

(30) Foreign Application Priority Data
Dec. 25, 2020     (JP) ................................. 2020-216874

(51) Int. Cl.
C30B 15/14          (2006.01)
C30B 29/06          (2006.01)
C30B 30/04          (2006.01)

(52) U.S. Cl.
CPC .............. C30B 15/14 (2013.01); C30B 29/06 (2013.01); C30B 30/04 (2013.01)

(58) Field of Classification Search
CPC .......... C30B 15/14; C30B 29/06; C30B 30/04
See application file for complete search history.

(56) References Cited

U.S. PATENT DOCUMENTS 5,330,729 A      7/1994  Oda et al.
5,766,347 A      6/1998  Shimomura et al.
(Continued)

FOREIGN PATENT DOCUMENTS

JP          H02103885 A  *  4/1990
JP          H04-260687 A     9/1992
(Continued)

OTHER PUBLICATIONS

Office Action issued in Corresponding DE Patent Application No. 112021006669.2, dated Jan. 20, 2025, along with an English translation thereof.
(Continued)

*Primary Examiner* — Hua Qi
(74) *Attorney, Agent, or Firm* — Greenblum & Bernstein, P.L.C.

(57)          ABSTRACT

A heating portion heats a silicon melt in a quartz crucible. The heating portion includes: a heat generation portion integrally molded into a cylinder; and four power supply portions for supplying electric power to the heat generation portion. When the heating portion is divided by a virtual plane into two including a first heating region located on one side of the heat generation portion and a second heating region located on the other side of the heat generation portion with respect to the virtual plane, the virtual plane passing through a center axis of the heat generation portion and being perpendicular to the heat generation portion and
(Continued)

parallel to a central magnetic field line of a horizontal magnetic field applied to the silicon melt, a heat generation amount of the first heating region and a heat generation amount of the second heating region are set to different values.

7 Claims, 16 Drawing Sheets

(56) References Cited

U.S. PATENT DOCUMENTS

| | | | | |
|---|---|---|---|---|
| 5,968,266 A | * | 10/1999 | Iino | C30B 15/14 117/917 |
| 2001/0008121 A1 | * | 7/2001 | Tanabe | H10K 71/40 118/723 VE |
| 2005/0205004 A1 | | 9/2005 | Sakurada et al. | |
| 2020/0399783 A1 | * | 12/2020 | Sakamoto | C30B 15/20 |
| 2021/0010152 A1 | | 1/2021 | Shen et al. | |

FOREIGN PATENT DOCUMENTS

| | | |
|---|---|---|
| JP | H09-227286 A | 9/1997 |
| JP | 2001-39792 A | 2/2001 |
| JP | 2004-315292 A | 11/2004 |
| KR | 10-2013-0022605 | 3/2013 |
| KR | 10-2020-0110388 | 9/2020 |
| TW | 328974 | 4/1998 |
| TW | 201938850 A | 10/2019 |
| WO | WO-2019167989 A1 * | 9/2019 ............ C30B 15/14 |

OTHER PUBLICATIONS

International Search Report issued in International Bureau of WIPO Patent Application No. PCT/JP2021/040759, dated Jan. 11, 2022, along with an English translation thereof.

Office Action issued in Taiwan Counterpart Patent Appl. No. 110145431, dated Sep. 21, 2022, along with an English translation thereof.

Office Action issued in Corresponding KR Patent Application No. 10-2023-7020589, dated Mar. 19, 2024, along with an English translation thereof.

International Preliminary Report on Patentability issued in Corresponding International Patent Application No. PCT/JP2021/040759, dated Jun. 13, 2023, along with an English translation thereof.

* cited by examiner

FIG.4
(A)
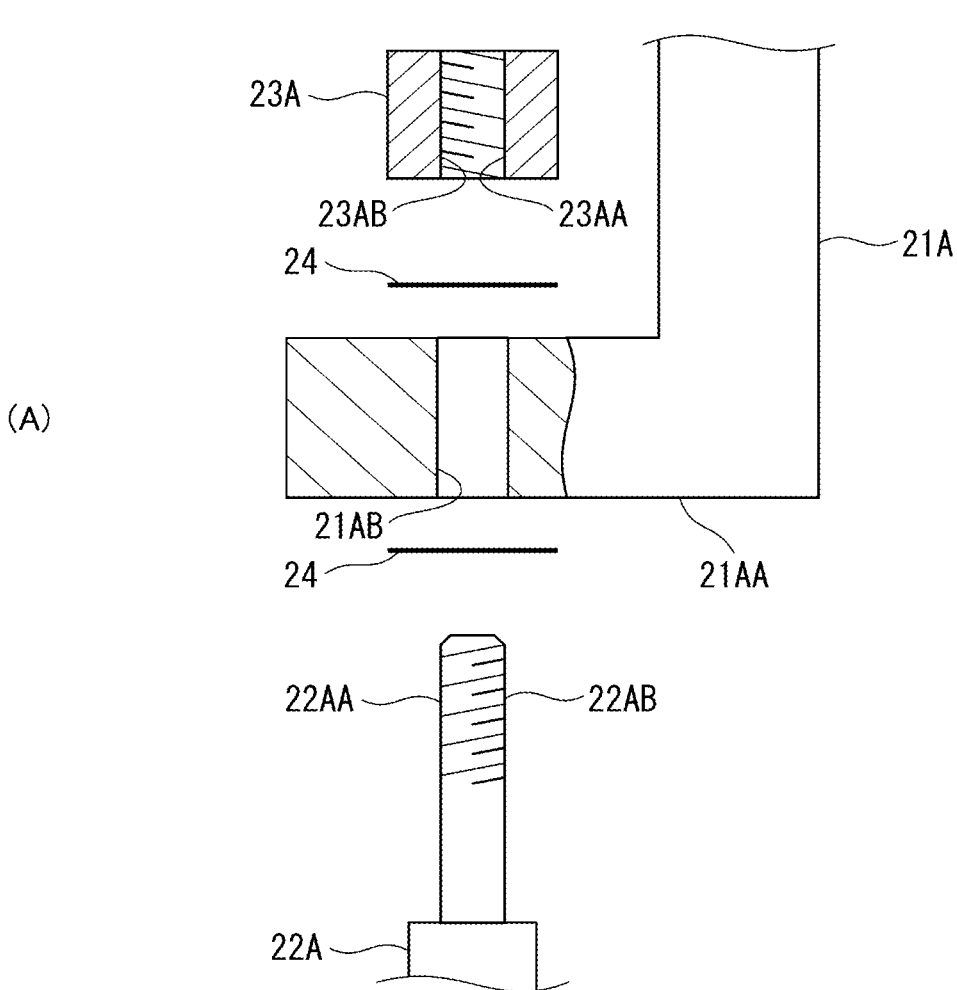
(B)

FIG.9

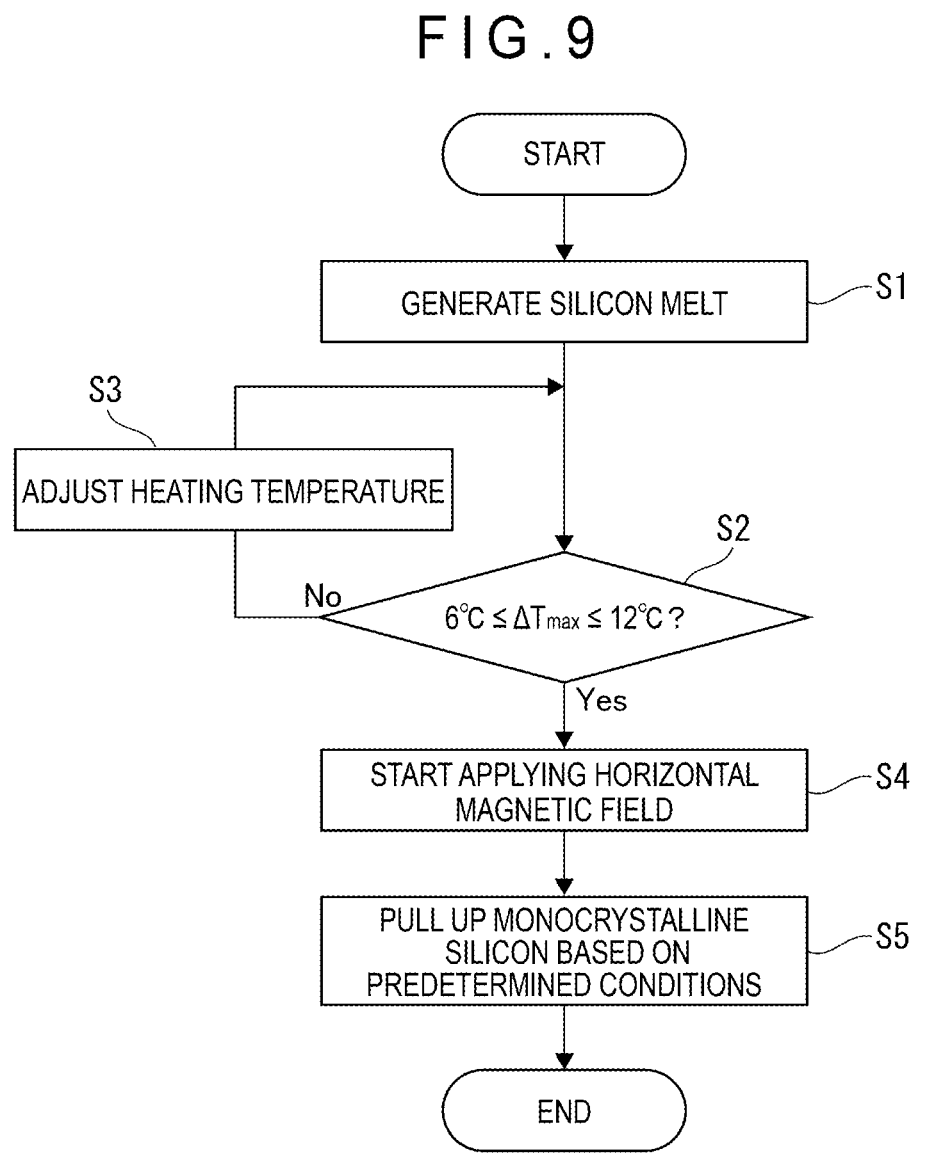

START

GENERATE SILICON MELT — S1

S3

ADJUST HEATING TEMPERATURE

No $6°C ≤ ΔT_{max} ≤ 12°C$ ?  — S2

Yes

START APPLYING HORIZONTAL MAGNETIC FIELD — S4

PULL UP MONOCRYSTALLINE SILICON BASED ON PREDETERMINED CONDITIONS — S5

END

F I G . 1 3
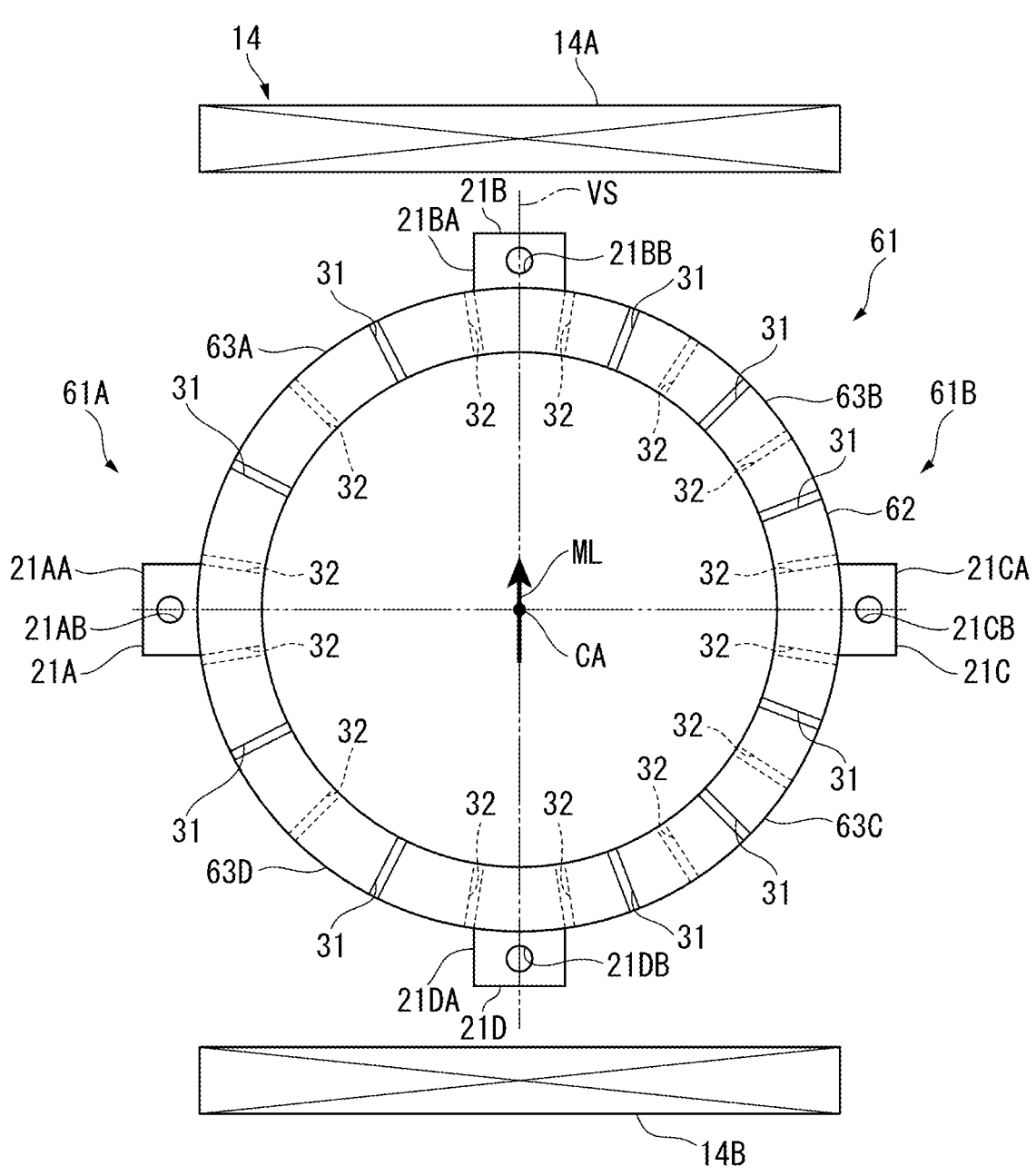

1

HEATING PART OF SILICON SINGLE CRYSTAL MANUFACTURING DEVICE, CONVECTION PATTERN CONTROL METHOD FOR SILICON MELT, SILICON SINGLE CRYSTAL MANUFACTURING METHOD, SILICON WAFER MANUFACTURING METHOD, SILICON SINGLE CRYSTAL MANUFACTURING DEVICE, AND CONVECTION PATTERN CONTROL SYSTEM FOR SILICON MELT

TECHNICAL FIELD

The present invention relates to a heating portion of monocrystalline silicon manufacturing equipment, the heating portion configured to heat a silicon melt in a crucible, a convection pattern control method of controlling a convection pattern in the silicon melt heated by the heating portion, a manufacturing method of monocrystalline silicon, a manufacturing method of a silicon wafer, monocrystalline silicon manufacturing equipment, and a convection pattern control system of a silicon melt.

BACKGROUND ART

A method called Czochralski method (hereinafter, referred to as CZ method) is used for manufacturing monocrystalline silicon. In a manufacturing method using this CZ method, various studies have been made for controlling a convection pattern of a silicon melt in a crucible (see, for instance, Patent Literature 1).

In the convection pattern control method disclosed in Patent Literature 1, the silicon melt is heated using a heating portion whose thermal capability differs between on both sides across a virtual line passing through the center of a surface of the silicon melt and being parallel to a central magnetic line of a horizontal magnetic field, and the horizontal magnetic field is applied to the silicon melt, thereby fixing a direction of a convection in a cross section orthogonal to the magnetic field.

CITATION LIST

Patent Literature(s)

Patent Literature 1: International Publication WO2019/167989

SUMMARY OF THE INVENTION

Problem(s) to be Solved by the Invention

In the convection pattern control method disclosed in Patent Literature 1, in order to make thermal capability of a heating portion differ between on both the sides across the virtual line of the heating portion, a heating portion and a heat insulation material, each of which is divided into right and left sides across the virtual line, are used as a graphite heater forming the heating portion and a heat insulation material.

However, a method of controlling a convection pattern of a silicon melt with a simple means is desired.

An object of the invention is to provide a heating portion of monocrystalline silicon manufacturing equipment which is capable of controlling a convection pattern of a silicon melt with a simple means, a convection pattern control method of a silicon melt, a manufacturing method of monocrystalline silicon, a manufacturing method of a silicon wafer, monocrystalline silicon manufacturing equipment, and a convection pattern control system of a silicon melt.

Means for Solving the Problem(s)

According to an aspect of the invention, a heating portion of monocrystalline silicon manufacturing equipment, the heating portion disposed outside and surrounding a quartz crucible and configured to heat a silicon melt in the quartz crucible, the heating portion includes: a heat generation portion integrally molded into a cylinder; and $2n$ pieces, $n$ being an integer of 2 or more, of power supply portions configured to supply electric power to the heat generation portion, in which, when the heating portion is divided by a virtual plane into two including a first heating region located on one side of the heat generation portion with respect to the virtual plane and a second heating region located on the other side of the heat generation portion with respect to the virtual plane, the virtual plane passing through a center axis of the heat generation portion, being perpendicular to the heat generation portion, and being parallel to a central magnetic field line of a horizontal magnetic field applied to the silicon melt, a heat generation amount of the first heating region and a heat generation amount of the second heating region are set to different values.

In the heating portion according to the above aspect, the heat generation amount of the first heating region and the heat generation amount of the second heating region are set to different values by setting a first resistance value and a second resistance value to different values, the first resistance value being a sum of resistance values of the heat generation portion and all the power supply portions provided in the first heating region, the second resistance value being a sum of resistance values of the heat generation portion and all the power supply portions provided in the second heating region.

In the heating portion according to the above aspect, the power supply portions each include: a terminal connected to the heat generation portion; and an electrode having one end connected to the terminal and the other end connected to a power source, a plate-shaped electrical resistance adjuster is interposed between the terminal and the electrode, and the first resistance value and the second resistance value are set to different values by making a total number of the electrical resistance adjuster interposed in the first heating region differ from a total number of the electrical resistance adjuster interposed in the second heating region.

In the heating portion according to the above aspect, the power supply portions each include: a terminal connected to the heat generation portion; an electrode having one end connected to the terminal and the other end connected to a power source; and a fastener fastening the terminal and the electrode, and the first resistance value and the second resistance value are set to different values by making fastening force of the fastener applied in the first heating region differ from fastening force of the fastener applied in the second heating region.

In the heating portion according to the above aspect, the power supply portions each include: a terminal connected to the heat generation portion, the heat generation portion and the terminal are bonded to each other through an adhesive layer, and the first resistance value and the second resistance value are set to different values by making a material or a thickness of the adhesive layer used in the power supply portion provided in the first heating region differ from a material or a thickness of the adhesive layer used in the power supply portion provided in the second heating region.

In the heating portion according to the above aspect, the power supply portions each include: a terminal connected to the heat generation portion, and the terminal is integrally molded with the heat generation portion.

The heating portion according to the above aspect further includes a resistance adjustment section attached to the terminal or the electrode and configured to adjust a resistance value between the terminal and the electrode.

In the heating portion according to the above aspect, the heat generation portion includes in a circumferential direction: a plurality of upper slits extending downward from an upper end of the heat generation portion; and a plurality of lower slits extending upward from a lower end of the heat generation portion, and the first resistance value and the second resistance value are set to different values by making one or both of a length and a total number of the upper slits and the lower slits differ between in the first heating region and in the second heating region.

In the heating portion according to the above aspect, the heat generation portion includes in a circumferential direction: a plurality of upper slits extending downward from an upper end of the heat generation portion; and a plurality of lower slits extending upward from a lower end of the heat generation portion, and the first resistance value and the second resistance value are set to different values by making an interval between each of the upper slits and its adjacent one of the lower slits differ between in the first heating region and in the second heating region.

In the heating portion according to the above aspect, the heat generation portion has a uniform thickness in a circumferential direction.

In the heating portion according to the above aspect, the power supply portions are arranged at positions facing each other across the quartz crucible and being orthogonal to the virtual plane.

According to another aspect of the invention, a convection pattern control method of a silicon melt used for manufacturing monocrystalline silicon includes: heating a silicon melt in a quartz crucible in a magnetic-field-free state using the heating portion of monocrystalline silicon manufacturing equipment according to the above aspect; and applying a horizontal magnetic field to the silicon melt being rotated in the quartz crucible, in which, in the applying of the horizontal magnetic field, the horizontal magnetic field of 0.2 tesla or more is applied to fix a direction of a convection in one direction in a plane orthogonal to an application direction of the horizontal magnetic field in the silicon melt.

According to still another aspect of the invention, a convection pattern control method of a silicon melt used for manufacturing monocrystalline silicon includes: setting a target convection pattern; on a basis of the set target convection pattern, calculating a heat generation amount required in the first heating region and a heat generation amount required in the second heating region of the heating portion of the monocrystalline silicon manufacturing equipment according to the above aspect; measuring a resistance value of the first heating region and a resistance value of the second heating region; calculating a resistance value required in the terminal on a basis of calculation results in the calculating of the heat generation amount and measurement results in the measuring of the resistance value; adjusting the resistance value of the terminal on a basis of calculation results in the calculating of the resistance value; heating a silicon melt in a quartz crucible in a magnetic-field-free state using the heating portion of the monocrystalline silicon manufacturing equipment; and applying a horizontal magnetic field to the silicon melt being rotated in the quartz crucible, in which, in the applying of the horizontal magnetic field, the horizontal magnetic field of 0.2 tesla or more is applied to fix a direction of a convection in one direction in a plane orthogonal to an application direction of the horizontal magnetic field in the silicon melt.

According to a further aspect of the invention, a manufacturing method of monocrystalline silicon includes: pulling up monocrystalline silicon using the convection pattern control method of a silicon melt according to the above aspect.

According to a still further aspect of the invention, a manufacturing method of a silicon wafer includes: cutting out a silicon wafer from monocrystalline silicon pulled up by the manufacturing method of monocrystalline silicon according to the above aspect.

According to a still further aspect of the invention, monocrystalline silicon manufacturing equipment includes: a quartz crucible; the heating portion of monocrystalline silicon manufacturing equipment according to the above aspect; and a magnetic-field applying portion arranged across the quartz crucible and configured to apply a horizontal magnetic field of 0.2 tesla or more to the silicon melt.

According to a still further aspect of the invention, a convection pattern control system configured to control a convection pattern of a silicon melt heated by the heating portion of the monocrystalline silicon manufacturing equipment according to the above aspect, the system includes: a convection pattern setting section configured to set a target convection pattern of the silicon melt; a heat generation amount calculation section configured to calculate a heat generation amount required in the first heating region and a heat generation amount required in the second heating region on a basis of the set target convection pattern; a resistance measurement section configured to measure a resistance value of the first heating region and a resistance value of the second heating region; a resistance calculation section configured to calculate a resistance value required in the terminal on a basis of calculation results by the heat generation amount calculation section and measurement results by the resistance measurement section; and a resistance adjustment section configured to adjust the resistance value of the terminal on a basis of calculation results by the resistance calculation section.

According to the above aspect of the invention, a convection pattern of a silicon melt is controllable with a simple means. Moreover, the convection pattern of the silicon melt is automatically controllable. This can suppress variations in quality and productivity of the monocrystalline silicon depending on furnaces and batches.

BRIEF EXPLANATION OF DRAWINGS

FIG. 4 is a conceptual diagram for explaining a method of fastening a terminal to an electrode, including a partially cutaway front view (A) and a plan view showing an electrical resistance adjuster (B).

FIG. 9 is a flowchart for explaining an exemplary manufacturing method of monocrystalline silicon.

FIG. 13 is a schematic plan view showing an exemplary configuration of a heater forming a heating portion according to a fourth exemplary embodiment of the invention.

DESCRIPTION OF EMBODIMENT(S)

Background for Invention

Figure 16A:
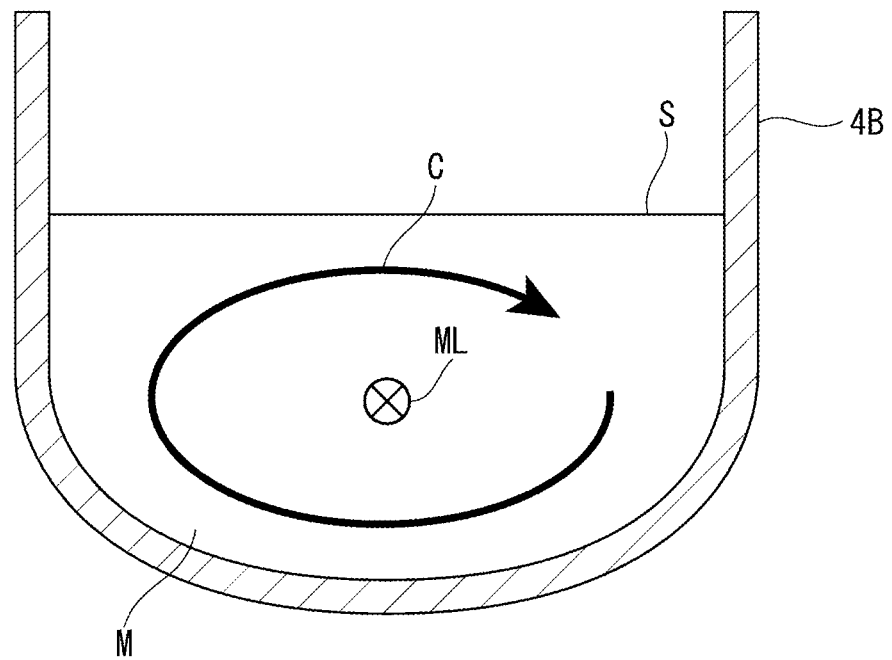
FIG. 16A is a schematic diagram showing a relationship between an application direction of a horizontal magnetic field and a direction of convection of a silicon melt for explaining the background for the invention, and represents a clockwise convection pattern.
Figure 16B:
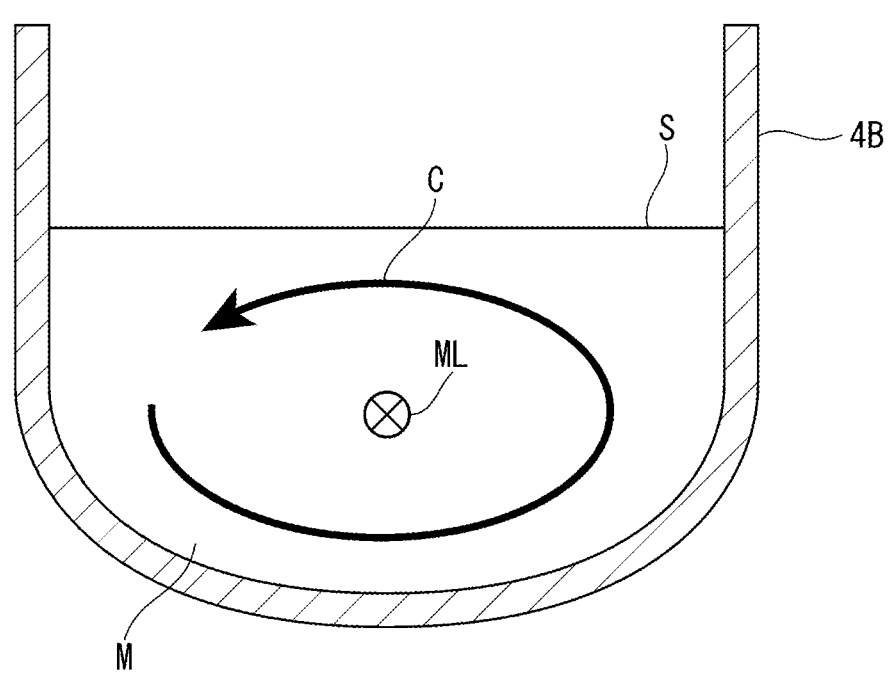
FIG. 16B is a schematic diagram showing a relationship between an application direction of a horizontal magnetic field and a direction of convection of a silicon melt for explaining the background for the invention, and represents an anticlockwise convection pattern.

The inventors have found that, after a solid polysilicon feedstock is put and melted in a quartz crucible 4B, when a horizontal magnetic field is applied to the silicon melt and monocrystalline silicon is pulled up, a convection C rotating in a direction from the bottom of the quartz crucible 4B toward a surface S of the silicon melt M is observed as shown in FIGS. 16A and 16B. The rotation direction of the convection C is shown by two convection patterns of a case where a clockwise rotation is dominant (right swirl) as shown in FIG. 16A and a case where an anticlockwise rotation is dominant (left swirl) as shown in FIG. 16B.

Oxygen eluted from the quartz crucible 4B is transported to a growing solid-liquid interface by the convection C of the silicon melt M and incorporated into monocrystalline silicon. Here, if thermal environments in monocrystalline silicon manufacturing equipment (furnaces) are completely axisymmetric and process conditions are the same, oxygen ought to be incorporated into monocrystalline silicon at equal amounts regardless of the right swirl or the left swirl.

However, an amount of oxygen transported by the right swirl is actually different from that by the left swirl due to non-uniform thermal environments caused by a non-axisymmetric shape of a furnace structure or misalignment of installation positions of components even if the furnace structure is axisymmetrically designed.

As a result, monocrystalline silicon grows with an oxygen concentration differing depending on the right swirl or the left swirl. Moreover, it is not constant which the right swirl or the left swirl occurs by a conventional manufacturing method. For this reason, monocrystalline silicon grows with an oxygen concentration differing due to a difference in the convection pattern even if the monocrystalline silicon grows in the same manufacturing equipment under the same process conditions. Accordingly, a conventional manufacturing method adversely affects oxygen controllability to significantly decrease a yield of monocrystalline silicon.

Therefore, in order to stabilize a quality of monocrystalline silicon in mass production, it is only required to set any one of two convection patterns as a target convection pattern before growth of monocrystalline silicon, and grow the monocrystalline silicon with the target convection pattern kept.

Driving force for forming two convection patterns shown in FIGS. 16A and 16B is a thermal convection. Specifically, in a case of the right swirl shown in FIG. 16A, a temperature on the left side of the figure is high to generate an upward flow while a temperature on the right side of the figure is low to generate a downward flow. Even if the thermal environment in the furnace is completely symmetrical, two symmetrical right and left swirls do not exist simultaneously because of being unstable. A flow distribution biased to the right swirl or the left swirl is more stable, always settling into one of the convection patterns (i.e., the right swirl and the left swirl). At this time, if the thermal environment in the furnace is positively biased to create a state where the temperature on the left side of the figure is high, the convection flow always takes the right swirl pattern shown in FIG. 16A.

Thus, by creating a temperature difference in a direction perpendicular to the horizontal magnetic field, it is possible to achieve a furnace in which only one convection pattern exists.

As a method of positively biasing the thermal environment in the furnace, the inventors have focused on a configuration of a resistance-heating-type heating portion that is arranged outside and surrounding the quartz crucible 4B horizontally placed and is configured to heat the silicon melt M in the quartz crucible 4B.

When viewed from vertically above, the heating portion is imaginarily divided by a virtual plane into two, namely, a first heating region located on the left side and a second heating region located on the right side with respect to the virtual plane. The virtual plane passes through a center axis of a cylindrical heat generation portion forming the heating portion, is perpendicular to the heat generation portion and is parallel to a central magnetic field line of the horizontal magnetic field. The first heating region and the second heating region are made mutually different in the heat generation amount. This positively biases the thermal environment in the furnace.

First Exemplary Embodiment

Figure 1:
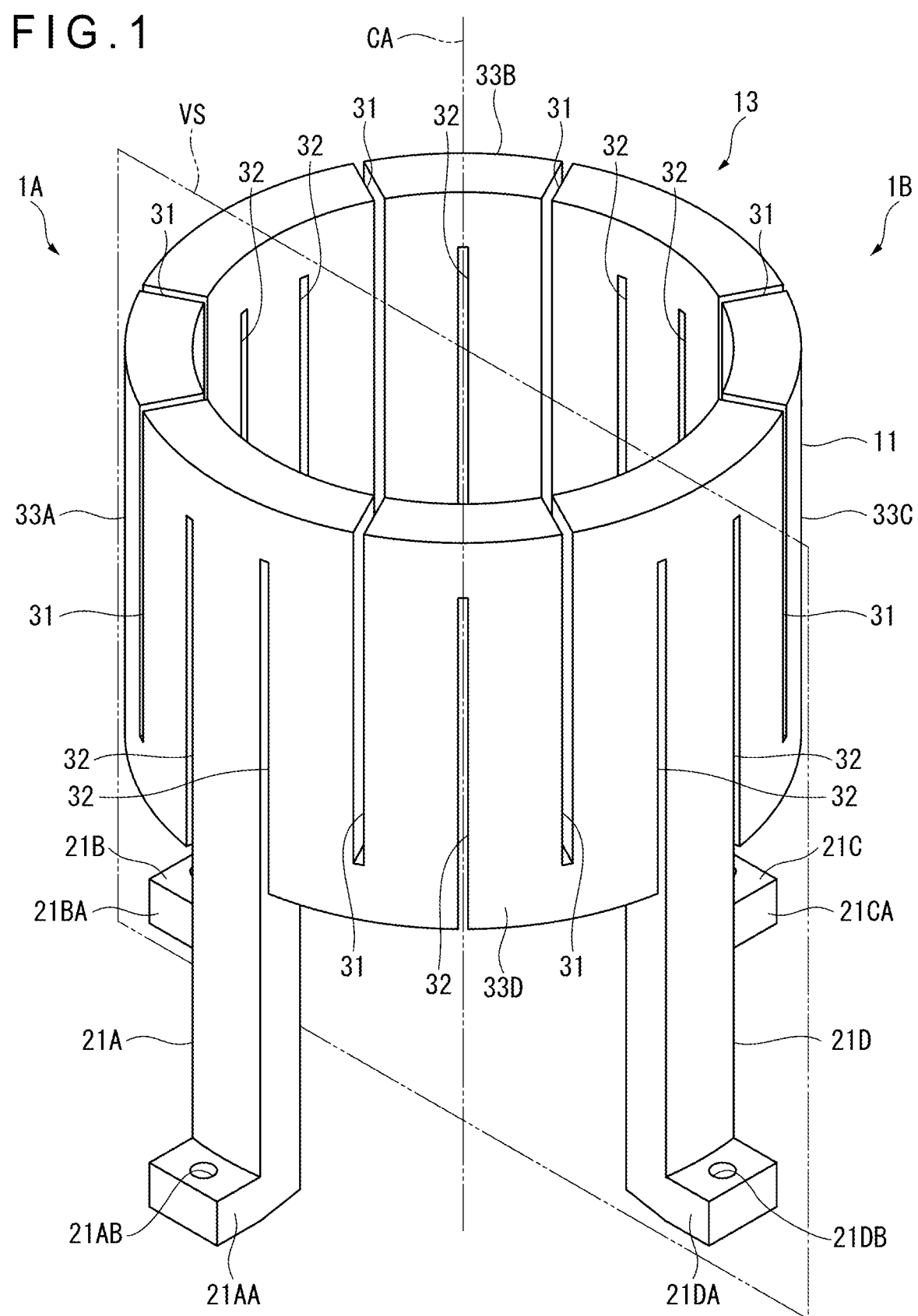
FIG. 1 is a perspective view showing an exemplary configuration of a heater forming a heating portion according to a first exemplary embodiment of the invention.
Figure 2:
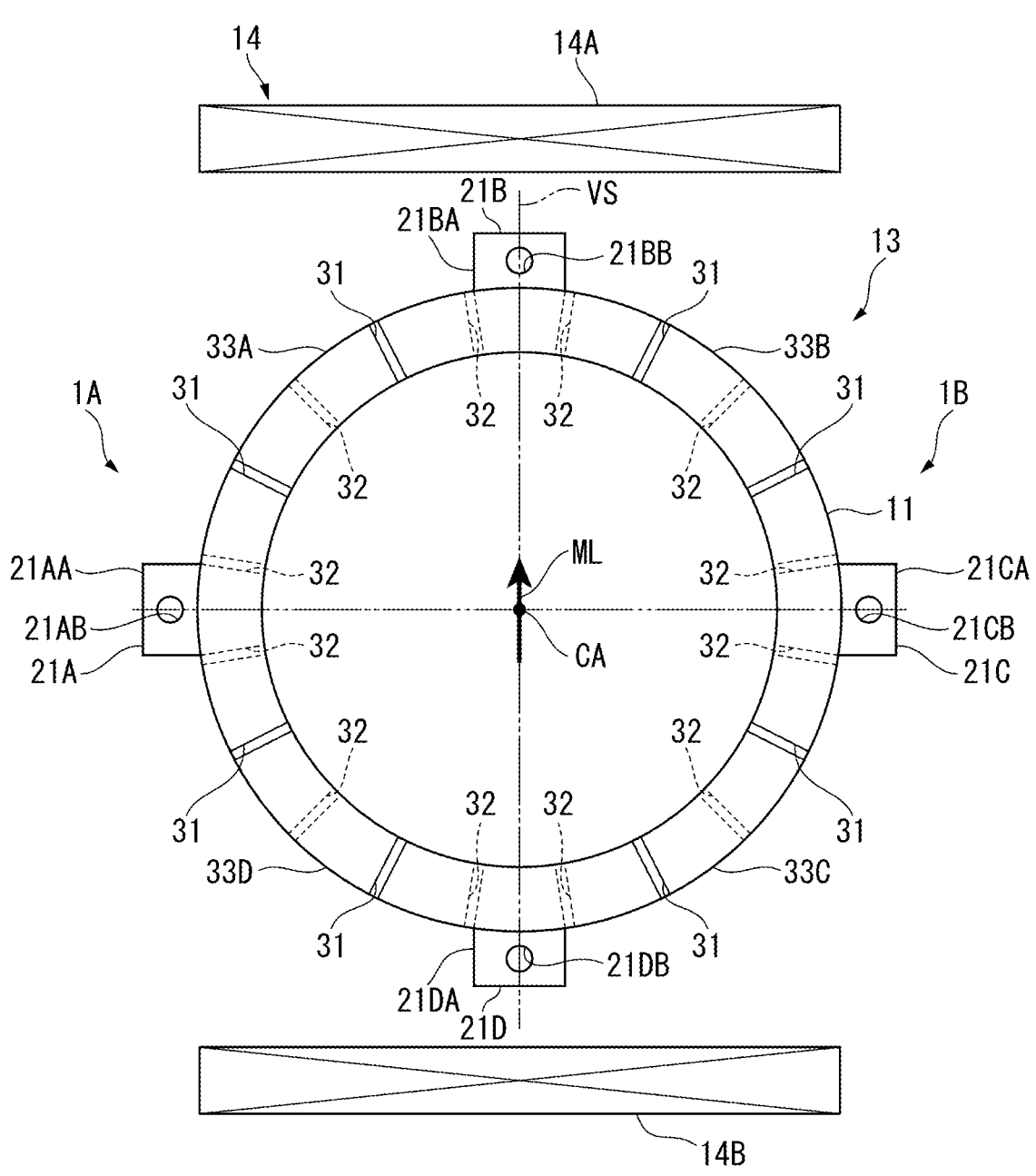
FIG. 2 is a schematic plan view showing the configuration of the heater shown in FIG. 1 and a state of application of a horizontal magnetic field in the heater.
Figure 3:
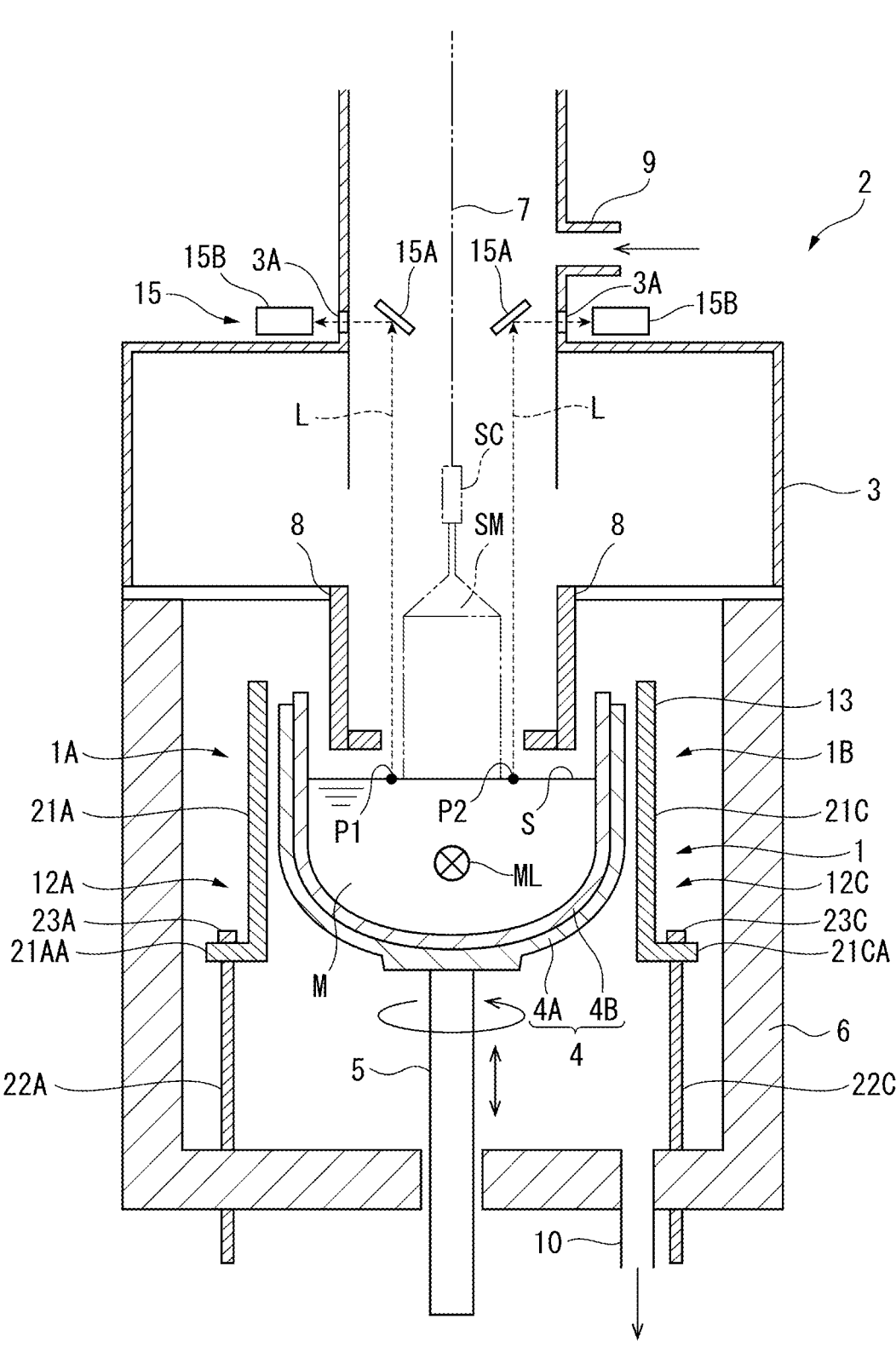
FIG. 3 is a conceptual diagram showing an exemplary principal configuration of monocrystalline silicon manufacturing equipment including the heater shown in FIG. 1.

As shown in FIGS. 1 to 3, a heating portion 1 in a first exemplary embodiment of the invention includes a heat generation portion 11 and 2n (n is an integer of 2 or more)

pieces of power supply portions configured to supply electric power to the heat generation portion 11. In the exemplary embodiment, four power supply portions 12A, 12B, 12C and 12D are provided. The power supply portions 12A, 12B, 12C and 12D respectively include: terminals 21A, 21B, 21C and 21D connected to the heat generation portion 11; electrodes 22A, 22B, 22C and 22D whose first ends are connected to the respective terminals 21A, 21B, 21C and 21D and second ends are connected to a power source; and fasteners 23A, 23B, 23C and 23D respectively fastening the terminals 21A, 21B, 21C and 21D to the electrodes 22A, 22B, 22C and 22D (see FIG. 3).

Configuration of Heater 13

FIG. 1 is a perspective view showing an exemplary configuration of a heater 13 forming a main part of the heating portion 1 according to the first exemplary embodiment of the invention. FIG. 2 is a top view showing the heater 13.

The heater 13 can be regarded as almost equivalent to the heating portion 1 since having most of a volume and a function of the heating portion 1. As shown in FIG. 2, when viewed from vertically above, the heater 13 is imaginarily divided by a virtual plane VS into two, namely, a first heating region 1A located on the left side with respect to the virtual plane VS and a second heating region 1B located on the right side with respect to the virtual plane VS. The virtual plane VS passes through a center axis CA of the heater 13, is perpendicular to the heater 13 and is parallel to a central magnetic field line of a horizontal magnetic field applied to the silicon melt M in the crucible 4 (see FIG. 3).

The heater 13 includes: the heat generation portion 11 that is a cylinder integrally molded in a circumferential direction; and the terminals 21A to 21D.

A thickness of the heat generation portion 11 is uniform in an entirely circumferential direction. The heat generation portion 11 includes: a plurality of upper slits 31 extending downward from an upper end of the heat generation portion 11; and a plurality of lower slits 32 extending upward from a lower end of the heat generation portion 11. The upper slits 31 and the lower slits 32 are formed in a circumferential direction of the heat generation portion 11. The upper slits 31 are equal in width and a cutout depth extending downward from the upper end. The lower slits 32 are equal in width and a cutout depth extending upward from the lower end. An interval between each upper slit 31 and its adjacent lower slit 32 is constant in the entire circumference of the heat generation portion 11.

In the heat generation portion 11, a total number of the upper slits 31 and the lower slits 32 in the first heating region 1A is the same as that in the second heating region 1B. In an example shown in FIGS. 1 and 2, four upper slits 31 and six lower slits 32 are formed in the first heating region 1A. The total number of the upper slits 31 and the lower slits 32 is ten. Also, four upper slits 31 and six lower slits 32 are formed in the second heating region 1B. The total number of the upper slits 31 and the lower slits 32 is ten.

The terminals 21A to 21D forming the respective power supply portions 12A to 12D are formed at the lower end of the heat generation portion 11 in a manner to be integrally molded with the heat generation portion 11. Two upper slits 31 and three lower slits 32 are alternately formed between the terminal 21A and the terminal 21B, thereby forming a first curve portion 33A. Similarly, two upper slits 31 and three lower slits 32 are alternately formed between the terminal 21B and the terminal 21C, thereby forming a second curve portion 33B.

Two upper slits 31 and three lower slits 32 are alternately formed between the terminal 21C and the terminal 21D, thereby forming a third curve portion 33C. Two upper slits 31 and three lower slits 32 are alternately formed between the terminal 21D and the terminal 21A, thereby forming a fourth curve portion 33D.

Connecting portions 21AA, 21BA, 21CA and 21DA each bent outward at a right angle are respectively formed at the lower ends of the terminals 21A to 21D in a manner to be integrally molded with the terminals 21A to 21D. Through holes 21AB, 21BB, 21CB and 21DB are drilled at the centers of the respective connecting portions 21AA to 21DA.

Configuration of Monocrystalline Silicon Manufacturing Equipment 2

FIG. 3 is a conceptual diagram showing an exemplary configuration of monocrystalline silicon manufacturing equipment 2 including the heating portion 1 according to the first exemplary embodiment of the invention.

The monocrystalline silicon manufacturing equipment 2, which is equipment for pulling up monocrystalline silicon SM by the CZ method, includes a chamber 3 forming an outer shell and a crucible 4 horizontally disposed at the center of the chamber 3.

The crucible 4, which has a double structure of an outer graphite crucible 4A and an inner quartz crucible 4B, is fixed to an upper end of a support shaft 5 that is rotatable and movable up and down.

Four electrodes 22A to 22D stand projecting from the bottom of the chamber 3 at substantially symmetrical positions with respect to the central axis of the crucible 4 as the axis of symmetry outside the crucible 4. Each of the electrodes 22A to 22D is formed in a prismatic or cylindrical shape. FIG. 3 only shows the electrodes 22A and 22C. The electrodes 22B and 22D are arranged at positions facing each other across the crucible 4 and being orthogonal to the virtual plane VS.

As shown in FIG. 4(A), an upper end 22AA of the electrode 22A is formed in a cylindrical shape with a reduced diameter. A male thread 22AB is formed on an outer circumference of the upper end 22AA. Similarly, male threads 22BB, 22CB and 22DB are respectively formed on outer circumferences of the upper ends 22 BA, 22CA and 22DA.

For instance, the fastener 23A has a hexagonal outer shape and a circular hole 23AA drilled at the center in an axial direction. The fastener 23A has a female thread 23AB formed in a circumferential surface defining the circular hole 23AA. Similarly, the fasteners 23B, 23C and 23D respectively have circular holes 23BA, 23CA and 23DA drilled at the centers in an axial direction, and have female threads 23BB, 23CB and 23DB formed in circumferential surfaces defining the circular holes 23BA, 23CA and 23DA.

The upper end 22AA of the electrode 22A is inserted into the through hole 21AB of the terminal 21A to project beyond an upper surface of the connecting portion 21AA. The electrode 22A is fastened to the terminal 21A by screwing the female thread 23AB of the fastener 23A with the male thread 22AB of the upper end 22AA. At this time, a plurality of disc-shaped electrical resistance adjusters 24 shown in FIG. 4(B) are interposed between the electrode 22A and a lower surface of the connecting portion 21AA and/or between an upper surface of the connecting portion 21AA and a lower surface of the fastener 23A. The electrical resistance adjuster 24 is, for instance, a carbon fiber material. The electrodes 22B to 22D are fastened to the corresponding terminals 21B to 21D in the same manner as the electrode 22A is fastened to the terminal 21A.

As described above, the heating portion 1 is provided surrounding the crucible 4 outside the crucible 4.

Outside the heating portion 1, a heat insulation material 6 is provided along an inner surface of the chamber 3.

Figure 5:
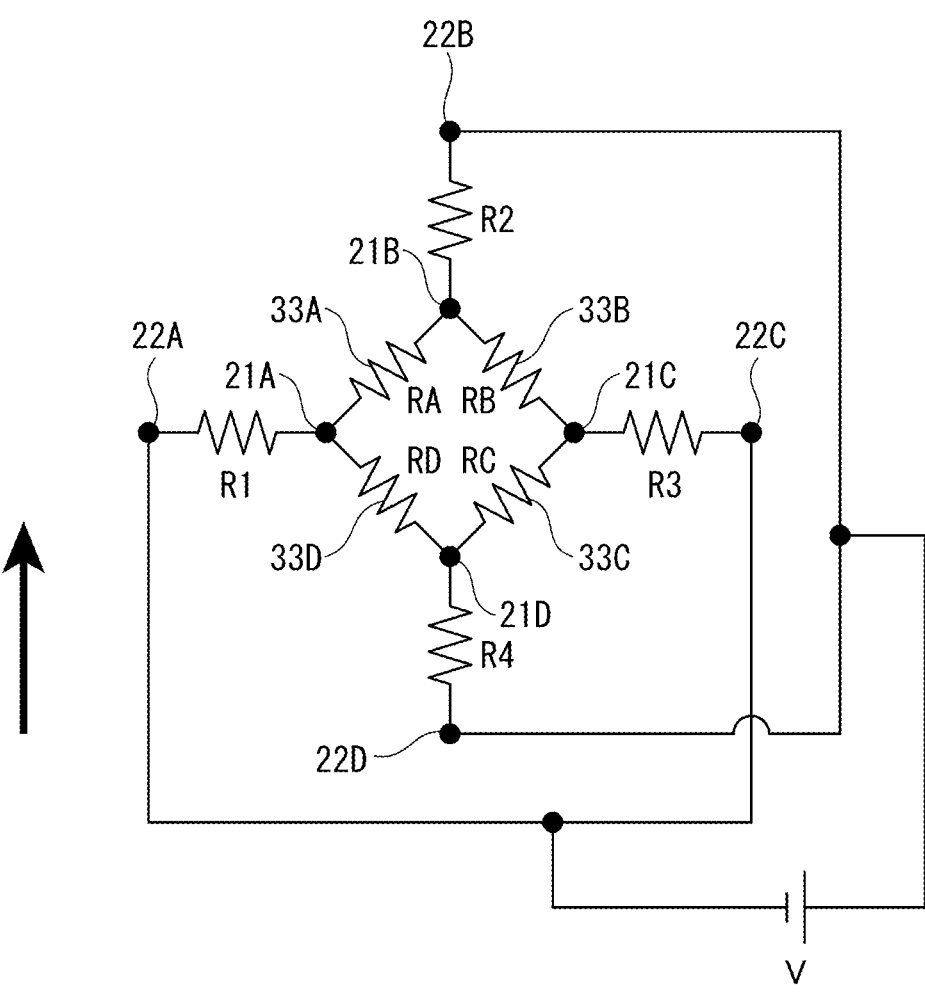
FIG. 5 is an equivalent circuit diagram of the heating portion.

FIG. 5 is an equivalent circuit diagram of the heating portion 1. In FIG. 5, V represents a value of voltage applied to the heating portion 1. RA, RB, RC and RD represent resistance values of the first to fourth curve portions 33A, 33B, 33C and 33D, respectively. R1 represents a contact resistance value between the terminal 21A and the electrode 22A. Similarly, R2 represents a contact resistance value between the terminal 21B and the electrode 22B, R3 represents a contact resistance value between the terminal 21C and the electrode 22C, and R4 represents a contact resistance value between the terminal 21D and the electrode 22D. In FIG. 5, an arrow shows a direction in which a horizontal magnetic field is applied.

The heat generation portion 1, the terminals 21A to 21D, and the electrodes 22A to 22D are made of graphite. Since graphite generally has low ductility, there is contact resistance at contact portions between the terminals 21A to 21D and the corresponding electrodes 22A to 22D. In FIG. 5, the resistance values of the electrodes 22A to 2D are ignored. This is because the electrodes are generally short, and an electric cable with an extremely small resistance value is used between each electrode and a voltage-applying section 43 (see FIG. 8) described later.

In the equivalent circuit diagram shown in FIG. 5, by changing the contact resistance values R1 to R4, it is possible to change a ratio of currents flowing through the first curve portion 33A, the second curve portion 33B, the third curve portion 33C, and the fourth curve portion 33D. The same applies to a case where an even number of six or more power supply portions 12 are provided.

In the first exemplary embodiment, among four power supply portions 12A to 12D arranged on right and left sides across the virtual plane VS, a resistance value of at least one power supply portion 12 is different from resistance values of the other power supply portions 12. Specifically, the contact resistance values of the power supply portions 12A to 12D are made different from each other by making the total number of the electrical resistance adjusters 24 interposed between the terminals 21A to 21D and the corresponding electrodes 22A to 22D for forming the respective power supply portions 12A to 12D differ therebetween.

For instance, the total number of the electrical resistance adjuster 24 interposed between the terminal 21A and the electrode 22A is made smaller than the total number of the electrical resistance adjuster 24 interposed between each of the terminals 21B to 1D 21D and the corresponding one of the electrodes 22 B to 22D for forming the power supply portions 12B to 12D.

In this arrangement, the resistance value of the first heating region 1A is smaller than the resistance value of the second heating region 1B. Accordingly, if voltage of the same magnitude is applied to the first heating region 1A and the second heating region 1B, the heat generation amount of the first heating region 1A becomes larger than that of the second heating region 1B.

Above the crucible 4, a pull-up shaft 7 such as a wire that rotates coaxially with the support shaft 5 in the opposite direction from the support shaft 5 or the same direction as the support shaft 5 at a predetermined speed is provided as shown in FIG. 3. A seed crystal SC is attached to a lower end of the pull-up shaft 7.

A hollow cylindrical heat shield 8 is disposed above the silicon melt M in the crucible 4 in the chamber 3 and surrounds the growing monocrystalline silicon SM.

The heat shield 8 shields the growing monocrystalline silicon SM from high-temperature radiation heat released from the silicon melt M in the crucible 4 and side walls of the heater 13 and the crucible 4, and also prevents outward heat diffusion from a solid-liquid interface, which is an interface on which crystal grows and a vicinity thereof, thereby controlling a temperature gradient of a central portion and an outer peripheral portion of the monocrystalline silicon SM in a direction of the pull-up shaft.

A gas inlet 9, through which an inert gas (e.g. Argon gas) is introduced into the chamber 3, is provided at an upper part of the chamber 3. An exhaust outlet 10, through which the gas in the chamber 3 is sucked and discharged when a vacuum pump (not shown) is driven, is provided at a lower part of the chamber 2.

The inert gas introduced in the chamber 3 through the gas inlet 9 flows downward between the growing monocrystalline silicon SM and the heat shield 8, then flows into a space between a lower end of the heat shield 8 and a liquid surface of the silicon melt M, then flows toward an outside of the heat shield 8 and further an outside of the crucible 4 and then downward along the outside of the crucible 4, and is discharged from the exhaust outlet 10.

The monocrystalline silicon manufacturing equipment 2 includes a magnetic-field applying portion 14 shown in FIG. 2 and a temperature sensor 15 shown in FIG. 3.

The magnetic-field applying portion 14 includes a first magnetic body 14A and a second magnetic body 14B each in a form of a solenoid coil. The first and second magnetic bodies 14A and 14B are provided outside the chamber 3 in a manner to face each other across the crucible 4. In an example shown in FIG. 2, the magnetic-field applying portion 14 applies a horizontal magnetic field so that a central magnetic field line passes through a center axis CA of the hollow cylindrical heat generation portion 11 and the heating portion 1 and a direction of the magnetic field line ML is in line with an upward direction in FIG. 2 (i.e., a direction from a nearby side to a far side on paper in FIG. 3). A height of the central magnetic field line, which is not particularly limited, may be determined so that the central magnetic field line passes through an inside or an outside of the silicon melt M depending on the quality of the monocrystalline silicon SM.

Figure 6:
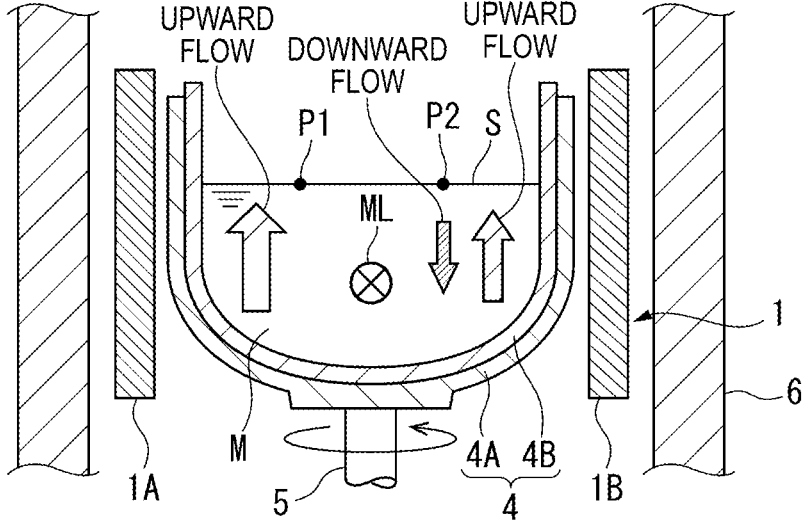
FIG. 6 is a schematic vertical cross-sectional view showing the configuration of the heating portion and the state of application of the horizontal magnetic field in the heating portion.
Figure 7:
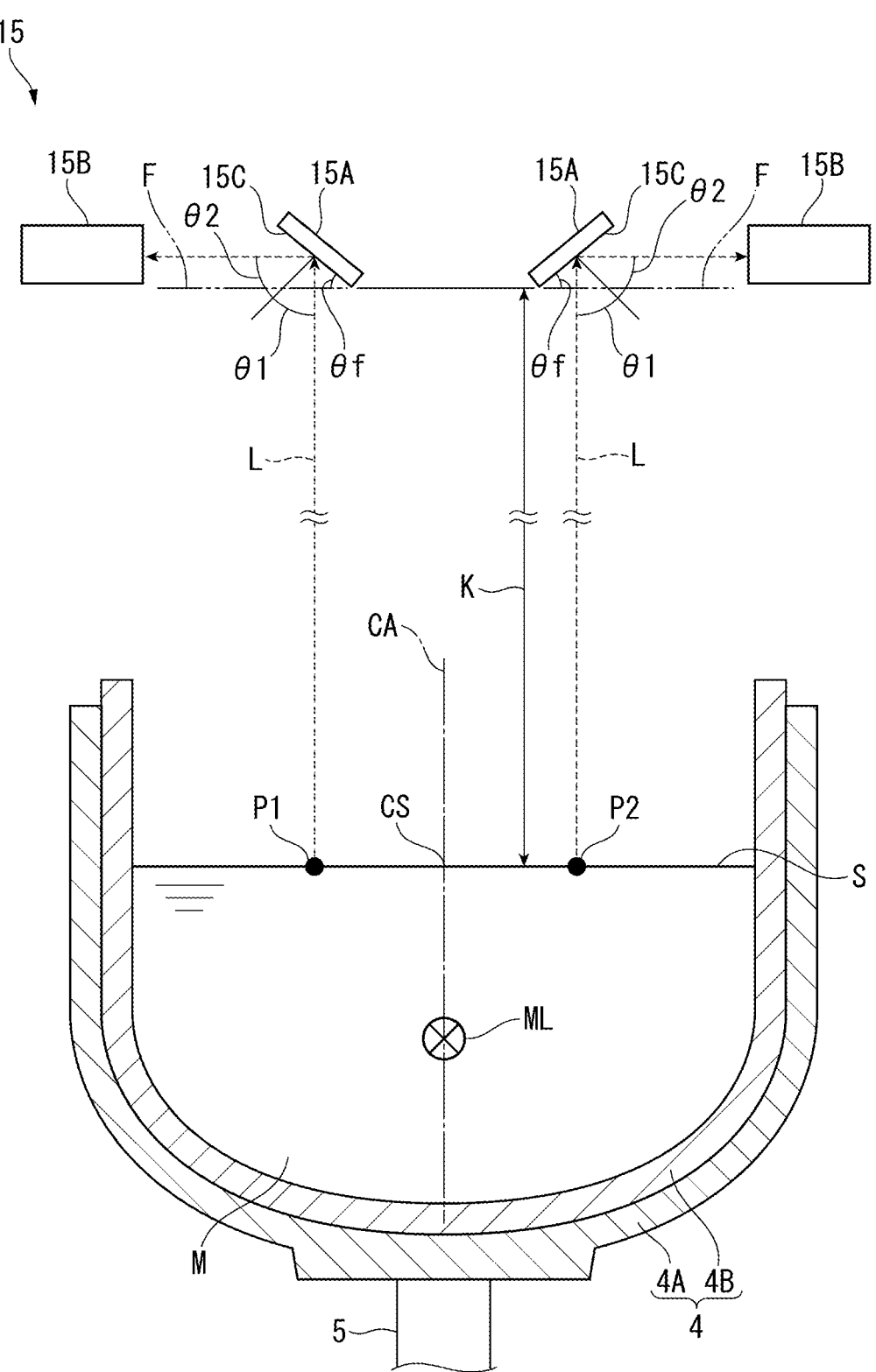
FIG. 7 is a schematic diagram showing an arrangement state of a temperature sensor.

The temperature sensor 15 measures temperatures at a first measurement point P1 and a second measurement point P2 across the virtual plane VS as shown in FIGS. 3, 6 and 7. The first measurement point P1 is set at a position of the highest temperature on a surface S of the silicon melt M when the downward flow is fixed on the right side in FIG. 6 by heating the silicon melt M by the heating portion 1. The second measurement point P2 is set at a position of the lowest temperature on the surface S of the silicon melt M when the downward flow is fixed on the right side. In the first exemplary embodiment, the first measurement point P1 and the second measurement point P2 are set at positions so as to be symmetrical with respect to a center CS of the surface S.

The temperature sensor 15 includes a pair of reflectors 15A and a pair of radiation thermometers 15B.

The reflectors 15A are provided inside the chamber 3. The reflectors 15A are preferably set as shown in FIG. 7 so that a distance (height) K from lower ends of the respective reflectors 15A to the surface S of the silicon melt M is in a range from 600 mm to 5000 mm. Moreover, the reflectors 15A are preferably set so that an angle θ formed between a reflection surface 15C and a horizontal plane F is in a range from 40 degrees to 50 degrees.

With the above-described configuration, a sum of an incident angle θ1 and a reflection angle θ2 formed between the reflectors 15A and a radiation light L emitted from the first measurement point P1 and the second measurement point P2 in a direction opposite to a gravity direction is in a range from 80 degrees to 100 degrees. From the viewpoint of heat resistance, the reflectors 15A are each preferably a silicon mirror whose one surface is mirror-polished to form a reflection surface 15C.

The radiation thermometers 15B are provided outside the chamber 3. The radiation thermometers 15B receive the radiation light L incident through a quartz window 3A (see FIG. 3) provided in the chamber 3, and measure the temperatures of the first measurement point P1 and the second measurement point P2 in a non-contact manner.

Figure 8:
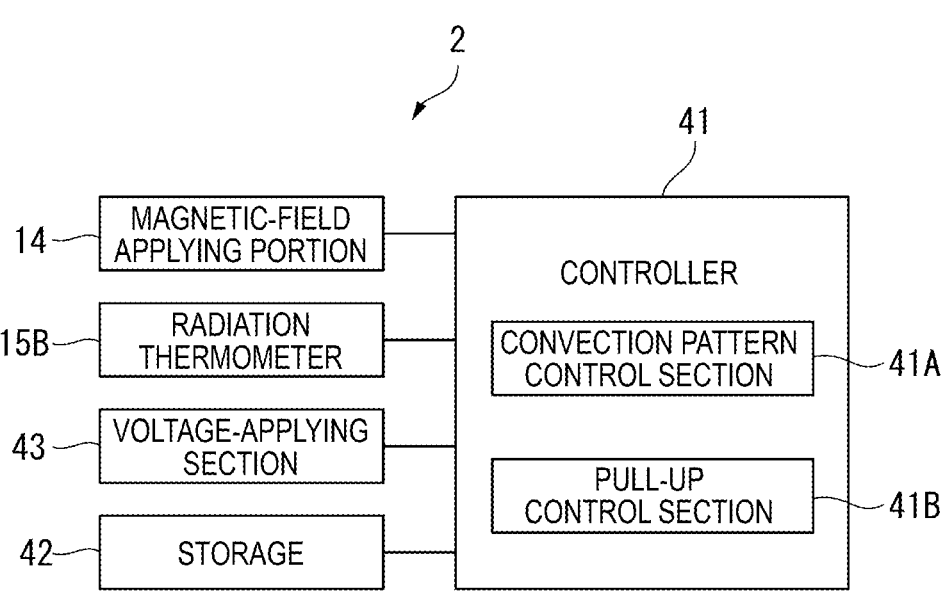
FIG. 8 is a block diagram showing an exemplary principal configuration of the monocrystalline silicon manufacturing equipment.

The monocrystalline silicon manufacturing equipment 2 includes a controller 41, a storage 42, and a voltage-applying section 43 as shown in FIG. 8.

The controller 41 includes a convection pattern control section 41A and a pull-up control section 41B.

The convection pattern control section 41A is configured to heat the silicon melt M using the heating portion 1 whose heat generation amount differs between on both sides across the virtual plane VS, and apply a horizontal magnetic field, thereby fixing a direction of a convection C in a cross section orthogonal to the magnetic field (see FIGS. 16A and 16B).

The pull-up control section 41B controls to pull up the monocrystalline silicon SM after the convection pattern control section 41A fixes the direction of the convection.

The storage 42 stores pull-up conditions (e.g., a flow rate of inert gas, an internal pressure of the chamber 3, and a rotation speed of the crucible 4) and the like for achieving a desired value of an oxygen concentration of the monocrystalline silicon SM.

The voltage-applying section 43 is controlled by the controller 41 to apply a predetermined voltage to the heating portion 1.

Manufacturing Method of Monocrystalline Silicon

Next, a manufacturing method of the monocrystalline silicon according to the exemplary embodiment is described with reference to the flowchart shown in FIG. 9.

Firstly, the pull-up conditions (e.g., a flow rate of inert gas, an internal pressure of the chamber 3, and a rotation speed of the crucible 4) and the like for achieving a desired value of the oxygen concentration of the monocrystalline silicon SM are determined in advance as predetermined conditions and are stored in the storage 42. The value of the oxygen concentration of the predetermined conditions may be values of the oxygen concentration at a plurality of positions in a longitudinal direction of the straight body forming the monocrystalline silicon SM or may be an average of the values of the oxygen concentration at the plurality of positions.

Manufacturing of the monocrystalline silicon SM is then started.

Firstly, the pull-up control section 41B maintains an inside of the chamber 3 in an inert gas atmosphere under reduced pressure. The convection pattern control section 41A, while rotating the crucible 4, melts a solid material such as polycrystalline silicon filled in the crucible 4 by heating with the heater 13 to generate the silicon melt M (Step S1).

At this time, the convection pattern control section 41A applies voltage of the same magnitude to the first heating region 1A and the second heating region 1B using the voltage-applying section 43, thereby heating a left portion (i.e., a portion close to the first heating region 1A) of the silicon melt M at a higher temperature than a right portion (i.e., a portion close to the second heating region 1B) of the silicon melt M. The convection pattern control section 41A also heats the silicon melt M so that the temperature of the silicon melt M is in a range from 1415 degrees C. to 1500 degrees C.

Subsequently, on the basis of the temperature measurement results of the first measurement point P1 and the second measurement point P2 by the temperature sensor 15, the convection pattern control section 41A judges whether a difference ΔTmax between the highest temperature (a temperature of the first measurement point P1) and the lowest temperature (a temperature of the second measurement point P2) on the surface S of the silicon melt M is stable in a range from 6 degrees C. to 12 degrees C. (Step S2).

The process in Step S2 is performed because the downward flow is sometimes not fixed on the right side with respect to the virtual plane VS at ΔTmax of less than 6 degrees C., but the downward flow is reliably fixed on the right side as shown in FIG. 6 at ΔTmax of 6 degrees C. or more. The process in Step S2 is performed also because the convection C becomes too large to sometimes cause variation in diameter in the pull-up direction of the straight body forming the monocrystalline silicon SM at ΔTmax of more than 12 degrees C., but the variation in diameter is inhibited at ΔTmax of 12 degrees C. or less.

In Step S2, when the convection pattern control section 41A determines that ΔTmax does not stably fall within a range from 6 degrees C. to 12 degrees C., the convection pattern control section 41A adjusts a heating temperature of the silicon melt M (Step S3) and performs the process of Step S2 after the elapse of a predetermined time. In Step S3, the convection pattern control section 41A increases the voltage applied to the first heating region 1A and the second heating region 1B by the same magnitude when ΔTmax is less than 6 degrees C., and decreases the voltage applied to the first heating region 1A and the second heating region 1B by the same magnitude when ΔTmax is more than 12 degrees C.

In Step S2, when the convection pattern control section 41A determines that ΔTmax stably falls within a range from 6 degrees C. to 12 degrees C., the convection pattern control section 41A controls the magnetic-field applying portion 14 to start applying a horizontal magnetic field in a range from 0.2 tesla to 0.6 tesla to the silicon melt M (Step S4). The convection C is fixed clockwise by this process in Step S4.

Subsequently, based on the predetermined conditions, the pull-up control section 41B immerses the seed crystal SC in the silicon melt M with the application of the horizontal magnetic field in a range from 0.2 tesla to 0.6 tesla being kept, and then pulls up the monocrystalline silicon SM having the straight body with a desired oxygen concentration (Step S5).

The above-described processes in Steps S1, S4 and S5 correspond to the manufacturing method of the monocrystalline silicon of the invention. The above-described processes in Steps S1 and S4 correspond to the convection pattern control method of the monocrystalline silicon of the invention.

It should be noted that the checking process of ΔTmax in Step S2, the adjusting process of the heating temperature in Step S3, the starting process of application of the horizontal magnetic field in Step S4, and the pull-up process in Step S5 may be operated by an operator.

The straight body forming the monocrystalline silicon SM pulled up using the above-described manufacturing method of the monocrystalline silicon is cut out into a silicon wafer using a wire saw or the like. Next, the cutout silicon wafer is subjected to lapping and polishing, thereby providing a final silicon wafer. This process corresponds to the manufacturing method of the silicon wafer of the invention.

Operation and Effects of First Exemplary Embodiment

In the first exemplary embodiment, among four power supply portions 12A to 12D arranged on the right and left sides across the virtual plane VS, a resistance value of at least one power supply portion 12 is made different from resistance values of the other power supply portions. Specifically, the contact resistance values of the power supply portions 12A to 12D are made different from each other by making the total number of the electrical resistance adjuster 24 interposed between the terminals 21A to 21D and the corresponding electrodes 22A to 22D for forming the respective power supply portions 12A to 12D differ therebetween.

With such a simple means, regardless of the symmetry of the configuration of the monocrystalline silicon manufacturing equipment 2, the direction of the convection C in the cross section orthogonal to the magnetic field can be easily fixed in one direction. By thus fixing the direction of the convection C in one direction, a variation in the oxygen concentration for each monocrystalline silicon SM can be suppressed. This suppresses variations in quality and productivity of the monocrystalline silicon depending on furnaces and batches.

Especially, the contact resistance values of the power supply portions 12A to 12D are made different from each other by differing the total number of the electrical resistance adjuster 24 interposed between each of the terminals 21A to 21D and the corresponding one of the electrodes 22A to 22D for forming the respective power supply portions 12A to 12D. With such a simple means, a variation in the oxygen concentration for each monocrystalline silicon SM can be suppressed.

According to the first exemplary embodiment, the heater 13 does not require special processing. Accordingly, a commercially available product is usable as the heater 13, thereby reducing costs. Moreover, a heater having a symmetrical shape and a uniform thickness is usable as the heater 13, leading to a high durability with a simple structure.

Second Exemplary Embodiment

Next, a second exemplary embodiment of the invention will be described. In the following description, the same reference numerals are given to the parts that have already been described, and the description thereof will be omitted.

Figure 10:
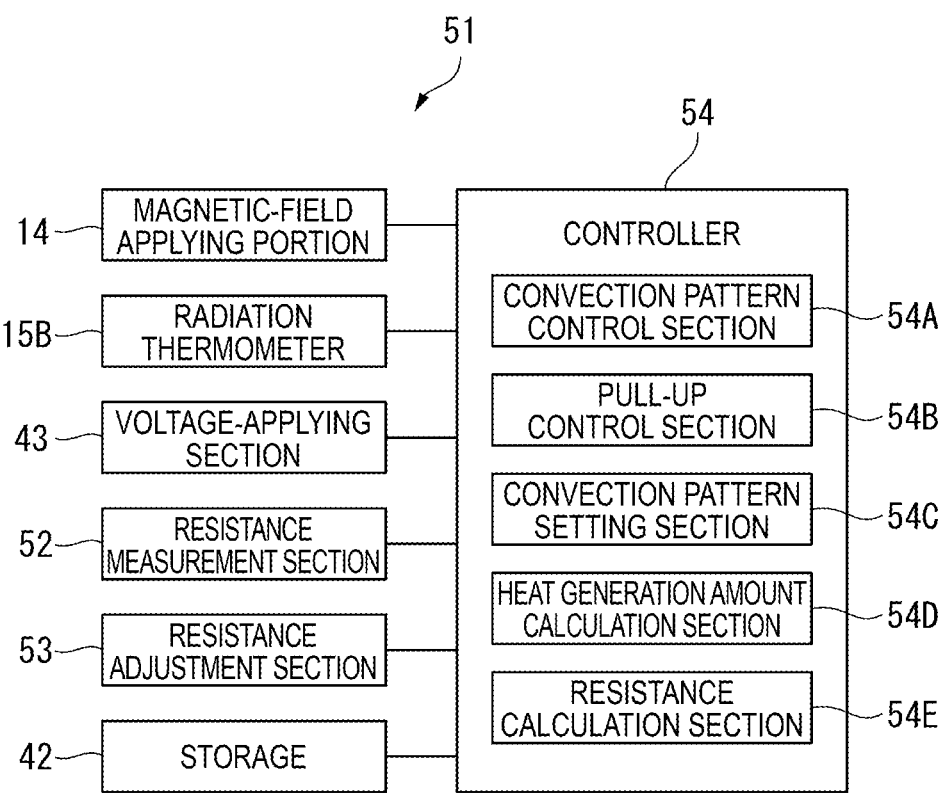
FIG. 10 is a block diagram showing an exemplary principal configuration of monocrystalline silicon manufacturing equipment to which a convection pattern control method of a silicon melt according to a second exemplary embodiment of the invention is applied.

FIG. 10 is a block diagram showing an exemplary principal configuration of monocrystalline silicon manufacturing equipment 51 to which a convection pattern control method of a silicon melt according to the second exemplary embodiment of the invention is applied.

The second exemplary embodiment is different from the first exemplary embodiment in a resistance measurement section 52 and a resistance adjustment section 53 newly provided, and a configuration of the controller 54.

The resistance measurement section 52 measures resistance values of the respective first heating region 1A and second heating region 1B of the heating portion 1.

The resistance adjustment section 53 adjusts the resistance values of the respective terminals 21A to 21D on the basis of calculation results by a later-described resistance calculation section 54E. Specifically, the resistance adjustment section 53 adjusts fastening forces of the fasteners 23A to 23D that fasten the corresponding terminals 21A to 21D and the corresponding electrodes 22A to 22D for forming the corresponding power supply portions 12A to 12D, thereby adjusting the contact resistance values between the terminals 21A to 21D and the corresponding electrodes 22A to 22D.

The controller 54 includes a convection pattern control section 54A, the pull-up control section 54B, a convection pattern setting section 54C, and the resistance calculation section 54E. The convection pattern control section 54A has a function of controlling the resistance measurement section 52 and the resistance adjustment section 53 in addition to the function of the convection pattern control section 41A. The pull-up control section 54B has the same function as the pull-up control section 41B.

The convection pattern setting section 54C sets a target convection pattern of the silicon melt M. The heat generation amount calculation section 54D calculates heat generation amounts required in the respective first heating region 1A and second heating region 1B on the basis of the convection pattern set by the convection pattern setting section 54C. The resistance calculation section 54E calculates resistance values required in the respective terminals 21A to 21D on the basis of the calculation results by the heat generation amount calculation section 54D and the measurement results by the resistance measurement section 52.

Convection Pattern Control Method of Silicon Melt

Figure 11:
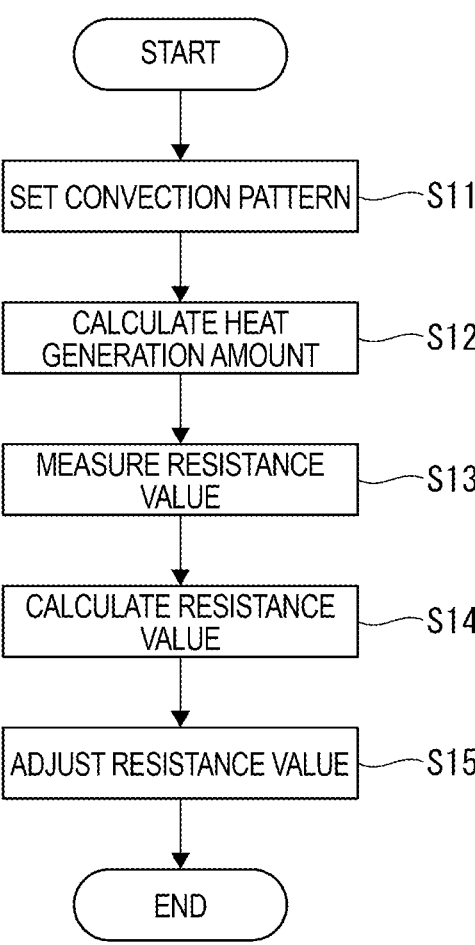
FIG. 11 is a flowchart for explaining an example of a first half of the convection pattern control method of the silicon melt according to the second exemplary embodiment.

FIG. 11 is a flowchart for explaining an example of a first half of the convection pattern control method of the silicon melt according to the second exemplary embodiment. The processes in the flowchart shown in FIG. 11 are executed before the processes in the flowchart shown in FIG. 9.

Firstly, the convection pattern setting section 54C sets a target convection pattern (Step S11). Specifically, the convection pattern setting section 54C selects one of the right swirl shown in FIG. 16A and the left swirl shown in FIG. 16B. This setting by the convection pattern is performed on the basis of, for instance, a manufacturing plan of monocrystalline silicon and trends of the monocrystalline silicon manufacturing equipment 51.

Next, the heat generation amount calculation section 54D calculates heat generation amounts required in the respective first heating region 1A and second heating region 1B on the basis of the convection pattern (the right swirl or the left swirl) set by the convection pattern setting section 54C (Step S12).

Next, the convection pattern control section 54A controls the resistance measurement section 52 to measure resistance values of the respective first heating region 1A and second heating region 1B of the heating portion 52 (Step S13). Accordingly, the resistance calculation section 54E calculates resistance values required in the respective terminals 21A to 21D on the basis of the calculation results by the heat generation amount calculation section 54D and the measurement results by the resistance measurement section 52 (Step S14).

Next, the convection pattern control section 54A controls the resistance adjustment section 54A to adjust the resistance values of the respective terminals 21A to 21D on the basis of calculation results by the resistance calculation section 54E. Accordingly, the resistance adjustment section 53 adjusts fastening forces of the fasteners 23A to 23D, thereby adjusting the contact resistance values between the terminals 21A to 21D and the corresponding electrodes 22A to 22D (Step S15).

For instance, when the convection pattern is set to be the right swirl, the heat generation amount calculation section 54D calculates so that the heat generation amount required in the first heating region 1A is larger than the heat generation amount required in the second heating region 1B. Next, the resistance measurement section 52 measures resistance values at present of the respective first heating region 1A and second heating region 1B. Next, the resistance calculation section 54E calculates resistance values required in the respective terminals 21A to 21D so that the resistance value of the first heating region 1A is smaller than the resistance value of the second heating region 1B on the basis of the calculation results by the heat generation amount calculation section 54D and the measurement results by the resistance measurement section 52.

For instance, when the measurement result shows that the resistance value of the first heating region 1A is approximately equal to the resistance value of the second heating region 1B, the resistance adjustment section 53 adjusts so that the fastening force of the fastener 23A is larger than the fastening forces of the other fasteners 23B to 23D in order to decrease the contact resistance value between the terminal 21A and the electrode 22A.

Accordingly, if voltage of the same magnitude is applied to the first heating region 1A and the second heating region 1B, the heat generation amount of the first heating region 1A becomes larger than that of the second heating region 1B.

Since the subsequent processes in the manufacturing method of the monocrystalline silicon are the same as those in the first exemplary embodiment, the description of the subsequent processes will be omitted.

The above-described processes in Steps S11 to S15 correspond to the manufacturing method of the monocrystalline silicon of the invention. The resistance measurement section 52, the resistance adjustment section 53, the functions added to the convection pattern control section 54A, the convection pattern setting section 54C, the heat generation amount calculation section 54D, and the resistance calculation section 54E correspond to the convection pattern control system of the silicon melt of the invention.

It should be noted that the setting process of the convection pattern in Step S11, the resistance measurement process in Step S13, and the resistance adjustment process in Step S15 may be operated by an operator.

Operation and Effects of Second Exemplary Embodiment

According to the second exemplary embodiment, the following operative effects can be produced in addition to the same operative effects as in the first exemplary embodiment.

With such a simple means as making the fastening forces of the fasteners 23A to 23D differ, a variation in the oxygen concentration for each monocrystalline silicon SM can be suppressed.

Moreover, since most of operations can be automated, working efficiency is improved.

Third Exemplary Embodiment

Next, a third exemplary embodiment of the invention will be described. In the following description, the same reference numerals are given to the parts that have already been described, and the description thereof will be omitted.

The third exemplary embodiment is different from the first exemplary embodiment in the configuration of a heater 16.

In the first exemplary embodiment, the heater 13 is configured so that the heat generation portion 11 are integrally molded with the terminals 21A to 21D.

Figure 12:
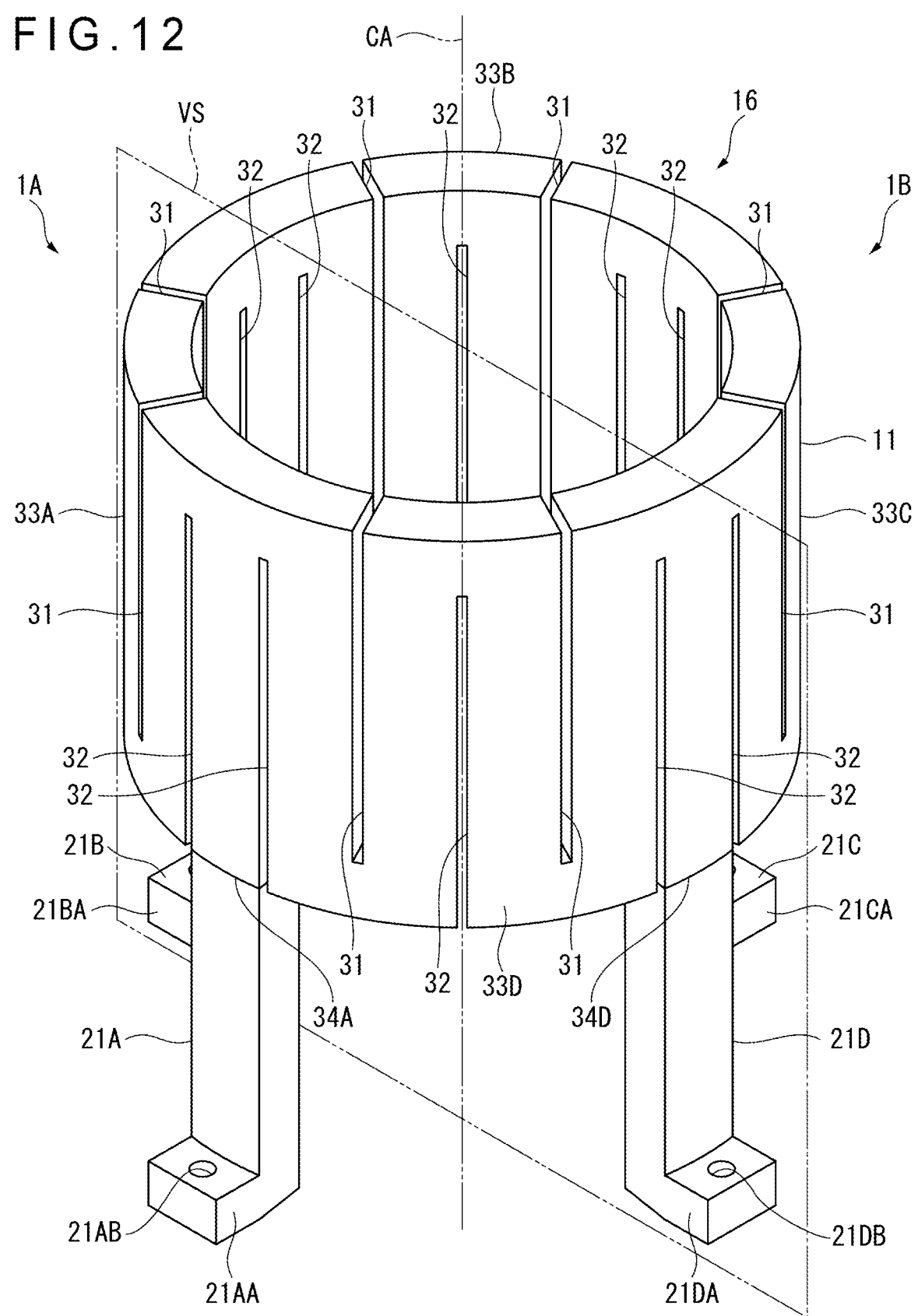
FIG. 12 is a perspective view showing an exemplary configuration of a heater forming a heating portion according to a third exemplary embodiment of the invention.

In contrast, in the third exemplary embodiment, the heater 16 is configured so that the heat generation portion 11 are connected to the terminals 21A to 21D through adhesive layers 34A, 34B, 34C and 34D as shown in FIG. 12. FIG. 12 only shows the adhesive layers 34A and 34D.

The adhesive layers 34 to 34D are formed by calcining or graphitizing a carbon adhesive containing an organic substance. Examples of the carbon adhesive include a thermosetting resin such as a COPNA resin, phenol resin, furan resin, and epoxy resin, and a thermoplastic resin such as pitch, polyethylene, polypropylene, and polyvinyl alcohol. Graphite powder or carbon powder may be added as an aggregate to these carbon adhesives.

In the third exemplary embodiment, the contact resistance values of the power supply portions 12A to 12D are made different from each other by making the adhesive layers 34 to 34D differ from each other in material and thickness, the adhesive layers 34 to 34D being applied between the heat generation portion 11 and the respective terminals 21A to 21D forming the respective power supply portions 12A to 12D.

For instance, the adhesive layer 34A applied between the heat generation portion 11 and the terminal 21A forming the power supply portion 12A is made different in material or larger in thickness as compared with the adhesive layers 34B to 34D applied between the heat generation portion 11 and the respective terminals 21B to 21D forming the other power supply portions 12B to 12D.

In this arrangement, the resistance value of the first heating region 1A is larger than the resistance value of the second heating region 1B. Accordingly, if voltage of the same magnitude is applied to the first heating region 1A and the second heating region 1B, the heat generation amount of the first heating region 1A becomes smaller than that of the second heating region 1B.

Since the manufacturing method of the monocrystalline silicon in the third exemplary embodiment is the same as that in the first exemplary embodiment, the description of the manufacturing method of the monocrystalline silicon in the third exemplary embodiment will be omitted.

Operation and Effects of Third Exemplary Embodiment

According to the third exemplary embodiment, with a simple means as only making the left side and the right side with respect to the virtual plane VS differ in the material or the thickness of the adhesive layers 34B to 34D applied between the heat generation portion 11 and the respective terminals 21A to 21D, regardless of the symmetry of the configuration of the monocrystalline silicon manufacturing equipment 2, the direction of the convection C in the cross section orthogonal to the magnetic field can be easily fixed in one direction. By thus fixing the direction of the convection C in one direction, a variation in the oxygen concentration for each monocrystalline silicon SM can be suppressed.

Fourth Exemplary Embodiment

Next, a fourth exemplary embodiment of the invention will be described with reference to FIG. 13. In the following description, the same reference numerals are given to the parts that have already been described, and the description thereof will be omitted.

The fourth exemplary embodiment is different from the first exemplary embodiment in the configuration of a heating portion 61.

The heating portion 61 includes a heat generation portion 62 and four power supply portions 12A to 12D.

As shown in FIG. 13, when viewed from vertically above, the heating portion 61 is imaginarily divided by the virtual plane VS into two, namely, a first heating region 61A located on the left side with respect to the virtual plane VS and a second heating region 61B located on the right side with respect to the virtual plane VS. The virtual plane VS passes through a center axis CA of the heating portion 61 and is perpendicular to the heating portion 61.

A thickness of the heat generation portion 62 is uniform in an entirely circumferential direction. The heat generation portion 62 includes: a plurality of upper slits 31 extending downward from an upper end of the heat generation portion 62; and a plurality of lower slits 32 extending upward from a lower end of the heat generation portion 62. The upper slits 31 and the lower slits 32 are formed in a circumferential direction of the heat generation portion 62. The upper slits 31 are equal in a cutout depth extending downward from the upper end. The lower slits 32 are equal in a cutout depth extending upward from the lower end. An interval between each upper slit 31 and its adjacent lower slit 32 is constant in the first heating region 61A. An interval between each upper slit 31 and its adjacent lower slit 32 is constant in the second heating region 61B.

The terminals 21A to 21D forming the respective power supply portions 12A to 12D are formed at the lower end of the heat generation portion 62 in a manner to be integrally molded with the heat generation portion 62. Two upper slits 31 and three lower slits 32 are alternately formed between the terminal 21A and the terminal 21B, thereby forming a first curve portion 63A. Similarly, three upper slits 31 and [three] four lower slits 32 are alternately formed between the terminal 21B and the terminal 21C, thereby forming a second curve portion 63B.

Three upper slits 31 and four lower slits 32 are alternately formed between the terminal 21C and the terminal 21D, thereby forming a third curve portion 63C. Two upper slits 31 and three lower slits 32 are alternately formed between the terminal 21D and the terminal 21A, thereby forming a fourth curve portion 63D.

Cross-sectional areas of the respective curve portions 63A and 63D are equal to each other in the first heating region 61A and cross-sectional areas of the respective curve portions 63B and 63C are equal to each other in the second heating region 61B. Although not easily understood from FIG. 13, in order to make the cross-sectional area of the curve portion 63C equal to the cross-sectional area of the curve portion 63D, some of the upper slits 31 are different in width and some of the lower slits 32 are different in width.

The heat generation portion 62 generates heat by Joule heat generation. Provided that a current value flowing through any point X of the heat generation portion 62 is denoted by Ix and a resistance value at the point X is denoted by Rx, a Joule heat generation amount Wx at the point X is represented by a formula (1).

$$Wx=Ix^2 \cdot Rx \qquad (1)$$

Accordingly, If the voltage value applied to the point X and the resistance value at the point X are given, the current value Ix flowing through the point X can be calculated in accordance with Ohm's law. By changing the resistance value Rx at the point X, the current value Ix flowing through the point X changes, and the Joule heat generation amount Wx also changes.

Accordingly, by appropriately changing the resistance value Rx at each point X, the Joule heat generation amount Wx at each point X of the heat generation portion 62 can be changed to achieve a desired heat generation amount distribution in the heat generation portion 62.

The resistance value Rx at the point X is represented by a formula (2) using an electrical resistivity p (Om) of the material forming the point X, a length L (m) of the point X, and a cross-sectional area A (m$^2$) of the point X.

$$Rx=\rho \cdot (L/A) \qquad (2)$$

In the fourth exemplary embodiment, the total number of the upper slits 31 and the lower slits 32 is made different between in the first heating region 61A and in the second heating region 61B, and the first curve portion 63A to the fourth curve portion 63D are different from each other in length. This makes the resistance value of the first heating region 61A different from the resistance value of the second heating region 61B.

In an example shown in FIG. 13, the total number of the upper slits 31 and the lower slits 32 is 10 in the first heating region 61A, while the total number of the upper slits 31 and the lower slits 32 is 14 in the second heating region 61B. Accordingly, since the total length of the second curve portion 63B and the third curve portion 63C is larger than the total length of the first curve portion 63A and the fourth curve portion 63D, the resistance value of the second heating region 61B is also larger than the resistance value of the first heating region 61A. Therefore, if voltage of the same magnitude is applied to the first heating region 61A and the second heating region 61B, the heat generation amount of the second heating region 61B becomes smaller than the heat generation amount of the first heating region 61A.

Since the manufacturing method of the monocrystalline silicon in the fourth exemplary embodiment is the same as that in the first exemplary embodiment, the description of the manufacturing method of the monocrystalline silicon in the fourth exemplary embodiment will be omitted.

Operation and Effects of Fourth Exemplary Embodiment

According to the fourth exemplary embodiment, with a simple means as only making the total number of the upper slits 31 and the lower slits 32 differ between on the left side and on the right side with respect to the virtual plane VS, regardless of the symmetry of the configuration of the monocrystalline silicon manufacturing equipment 2, the direction of the convection C in the cross section orthogonal to the magnetic field can be easily fixed in one direction. By thus fixing the direction of the convection C in one direction, a variation in the oxygen concentration for each monocrystalline silicon SM can be suppressed.

Fifth Exemplary Embodiment

Next, a fifth exemplary embodiment of the invention will be described with reference to FIG. 14. In the following description, the same reference numerals are given to the parts that have already been described, and the description thereof will be omitted.

The fifth exemplary embodiment is different from the first exemplary embodiment in the configuration of a heating portion 71.

The heating portion 71 includes a heat generation portion 72 and four power supply portions 12A to 12D.

Figure 14:
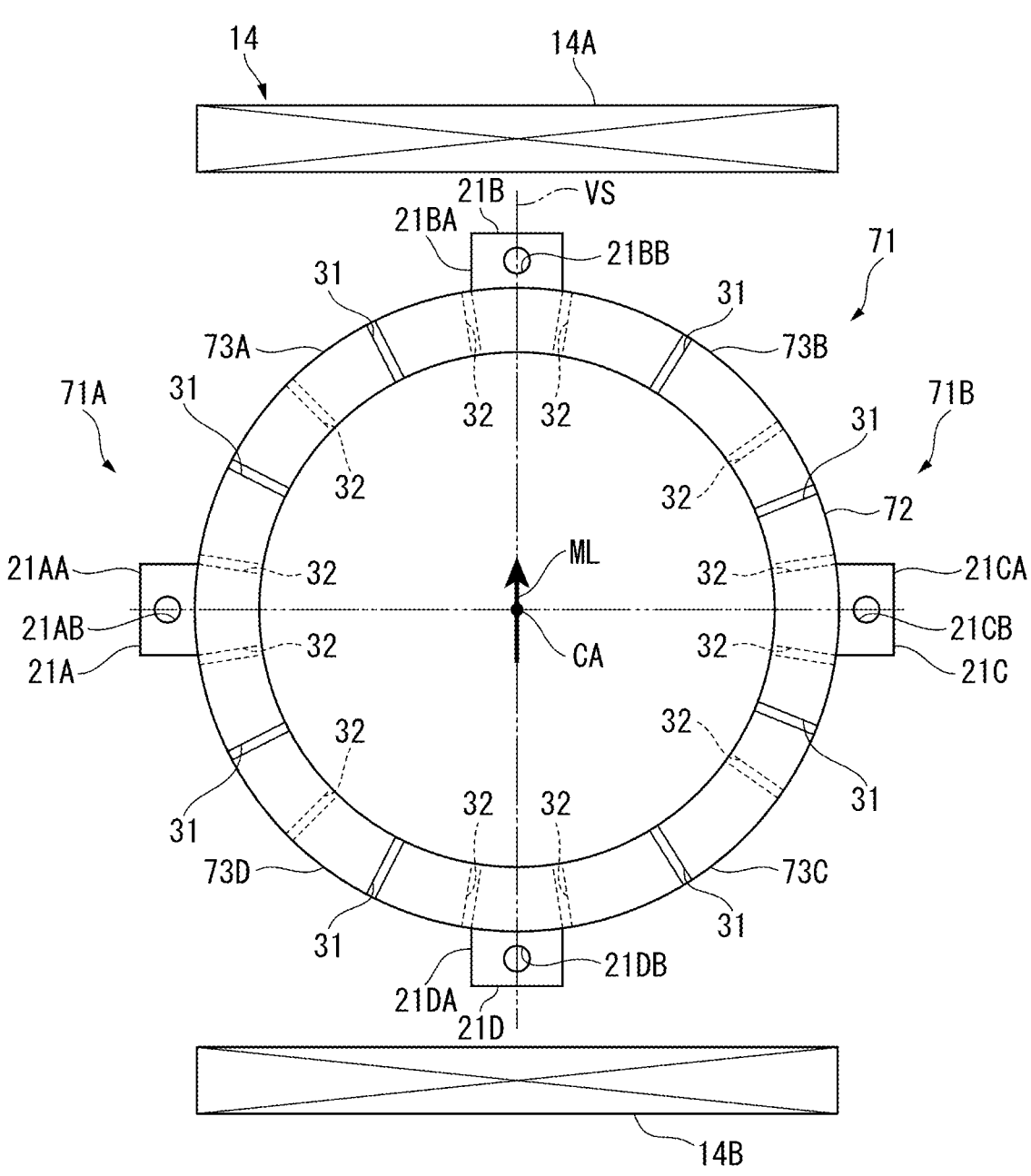
FIG. 14 is a schematic plan view showing an exemplary configuration of a heater forming a heating portion according to a fifth exemplary embodiment of the invention.

As shown in FIG. 14, when viewed from vertically above, the heating portion 71 is imaginarily divided by the virtual plane VS into two, namely, a first heating region 71A located on the left side with respect to the virtual plane VS and a second heating region 71B located on the right side with respect to the virtual plane VS. The virtual plane VS passes through a center axis CA of the heating portion 71 and is perpendicular to the heating portion 61.

A thickness of the heat generation portion 72 is uniform in an entirely circumferential direction. The heat generation portion 72 includes: a plurality of upper slits 31 extending downward from an upper end of the heat generation portion 72; and a plurality of lower slits 32 extending upward from a lower end of the heat generation portion 72. The upper slits 31 and the lower slits 32 are formed in a circumferential direction of the heat generation portion 72. The upper slits 31 are equal in width and a cutout depth extending downward from the upper end. The lower slits 32 are equal in width and a cutout depth extending upward from the lower end.

The terminals 21A to 21D forming the respective power supply portions 12A to 12D are formed at the lower end of the heat generation portion 72 in a manner to be integrally molded with the heat generation portion 72. Two upper slits 31 and three lower slits 32 are alternately formed between the terminal 21A and the terminal 21B, thereby forming a first curve portion 73A. Similarly, two upper slits 31 and three lower slits 32 are alternately formed between the terminal 21B and the terminal 21C, thereby forming a second curve portion 73B.

Two upper slits 31 and three lower slits 32 are alternately formed between the terminal 21C and the terminal 21D, thereby forming a third curve portion 73C. Two upper slits 31 and three lower slits 32 are alternately formed between the terminal 21D and the terminal 21A, thereby forming a fourth curve portion 73D.

In the heat generation portion 72 according to the fifth exemplary embodiment, the total number of the upper slits 31 and the lower slits 32 in the first heating region 71A is the same as that in the second heating region 71B. In an example shown in FIG. 14, four upper slits 31 and six lower slits 32 are formed in the first heating region 71A. The total number of the upper slits 31 and the lower slits 32 is ten. Also, four upper slits 31 and six lower slits 32 are formed in the second heating region 71B. The total number of the upper slits 31 and the lower slits 32 is ten.

Within the first heating region 71A, an interval between each upper slit 31 and its adjacent lower slit 32 is constant. In contrast, within the second heating region 71B, the upper slits 31 and the lower slits 32 are concentrated near the terminal 21C. Specifically, the intervals are narrow between the upper slits 31 and respective adjacent lower slits 32 in the direction perpendicular to the horizontal magnetic field in the horizontal plane when the heating portion 71 is viewed from vertically above. This arrangement decreases the cross-sectional area A (m²) of the point X in the formula (2) in the direction perpendicular to the horizontal magnetic field in the horizontal plane.

Accordingly, the resistance value near the terminal 21C of the second heating region 71B is larger than the resistance value of the rest of the second heating region 71B. Therefore, if voltage of the same magnitude is applied to the first heating region 71A and the second heating region 71B, the heat generation amount of the second heating region 71B becomes smaller than the heat generation amount of the first heating region 71A.

Since the manufacturing method of the monocrystalline silicon in the fifth exemplary embodiment is the same as that in the first exemplary embodiment, the description of the manufacturing method of the monocrystalline silicon in the fifth exemplary embodiment will be omitted.

Operation and Effects of Fifth Exemplary Embodiment

According to the fifth exemplary embodiment, with a simple means as only making the interval between each upper slit 31 and its adjacent lower slit 32 differ between on the left side and on the right side with respect to the virtual plane VS, regardless of the symmetry of the configuration of the monocrystalline silicon manufacturing equipment 2, the direction of the convection C in the cross section orthogonal to the magnetic field can be easily fixed in one direction. By thus fixing the direction of the convection C in one direction, a variation in the oxygen concentration for each monocrystalline silicon SM can be suppressed.

Sixth Exemplary Embodiment

Next, a sixth exemplary embodiment of the invention will be described with reference to FIG. 15. In the following description, the same reference numerals are given to the parts that have already been described, and the description thereof will be omitted.

The sixth exemplary embodiment is different from the first exemplary embodiment in the configuration of a heating portion 81.

The heating portion 81 includes a heat generation portion 82 and four power supply portions 12A to 12D.

Figure 15:
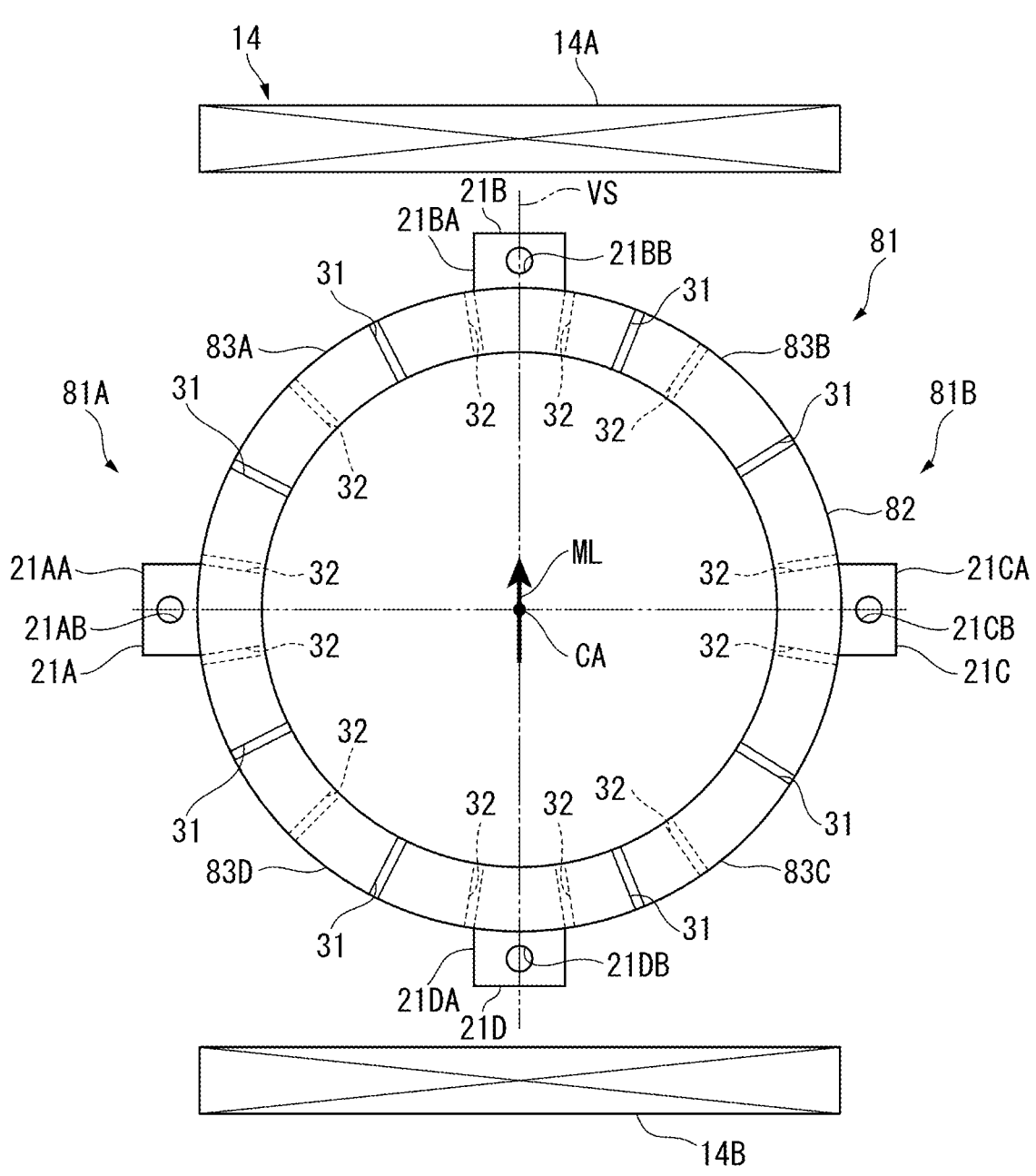
FIG. 15 is a schematic plan view showing an exemplary configuration of a heater forming a heating portion according to a sixth exemplary embodiment of the invention.

As shown in FIG. 15, when viewed from vertically above, the heating portion 81 is imaginarily divided by the virtual plane VS into two, namely, a first heating region 81A located on the left side with respect to the virtual plane VS and a second heating region 81B located on the right side with respect to the virtual plane VS. The virtual plane VS passes through a center axis CA of the heating portion 81 and is perpendicular to the heating portion 61.

A thickness of the heat generation portion 82 is uniform in an entirely circumferential direction. The heat generation portion 82 includes: a plurality of upper slits 31 extending downward from an upper end of the heat generation portion 82; and a plurality of lower slits 32 extending upward from a lower end of the heat generation portion 82. The upper slits 31 and the lower slits 32 are formed in a circumferential direction of the heat generation portion 82. The upper slits 31 are equal in width and a cutout depth extending downward from the upper end. The lower slits 32 are equal in width and a cutout depth extending upward from the lower end.

The terminals 21A to 21D forming the respective power supply portions 12A to 12D are formed at the lower end of the heat generation portion 82 in a manner to be integrally molded with the heat generation portion 82. Two upper slits 31 and three lower slits 32 are alternately formed between the terminal 21A and the terminal 21B, thereby forming a first curve portion 83A. Similarly, two upper slits 31 and three lower slits 32 are alternately formed between the terminal 21B and the terminal 21C, thereby forming a second curve portion 83B.

Two upper slits 31 and three lower slits 32 are alternately formed between the terminal 21C and the terminal 21D, thereby forming a third curve portion 83C. Two upper slits 31 and three lower slits 32 are alternately formed between the terminal 21D and the terminal 21A, thereby forming a fourth curve portion 83D.

In the heat generation portion 82 according to the sixth exemplary embodiment, the total number of the upper slits 31 and the lower slits 32 in the first heating region 81A is the same as that in the second heating region 81B. In an example shown in FIG. 15, four upper slits 31 and six lower slits 32 are formed in the first heating region 81A. The total number of the upper slits 31 and the lower slits 32 is ten. Also, four upper slits 31 and six lower slits 32 are formed in the second heating region 81B. The total number of the upper slits 31 and the lower slits 32 is ten.

Within the first heating region 81A, an interval between each upper slit 31 and its adjacent lower slit 32 is constant. In contrast, within the second heating region 81B, the upper slits 31 and the lower slits 32 are concentrated near the terminals 21B and 21D. Specifically, the intervals are large between the upper slits 31 and their adjacent lower slits 32 in the direction perpendicular to the horizontal magnetic field in the horizontal plane when the heating portion 81 is viewed from vertically above. This arrangement increases the cross-sectional area A (m$^2$) of the point X in the formula (2) in the direction perpendicular to the horizontal magnetic field in the horizontal plane.

Accordingly, the resistance value near the terminal 21C of the second heating region 81B is smaller than the resistance value of the rest of the second heating region 81B. Therefore, if voltage of the same magnitude is applied to the first heating region 81A and the second heating region 81B, the heat generation amount of the second heating region 81B becomes larger than the heat generation amount of the first heating region 81A.

Since the manufacturing method of the monocrystalline silicon in the sixth exemplary embodiment is the same as that in the first exemplary embodiment, the description of the manufacturing method of the monocrystalline silicon in the sixth exemplary embodiment will be omitted.

Operation and Effects of Sixth Exemplary Embodiment

According to the sixth exemplary embodiment, with a simple means as only making the interval between each upper slit 31 and its adjacent lower slit 32 differ between on the left side and on the right side with respect to the virtual plane VS, regardless of the symmetry of the configuration of the monocrystalline silicon manufacturing equipment 2, the direction of the convection C in the cross section orthogonal to the magnetic field can be easily fixed in one direction. By thus fixing the direction of the convection C in one direction, a variation in the oxygen concentration for each monocrystalline silicon SM can be suppressed.

Modifications

It should be understood that the scope of the invention is not limited by the above exemplary embodiments, but various improvements and design modifications compatible with the invention are possible.

For instance, in the first exemplary embodiment, the resistance values of the respective electrodes 22A to 22D are ignored in the equivalent circuit diagram shown in FIG. 5, but the invention is not limited thereto. The resistance values of the respective electrodes 22A to 22D may also be considered. One or both of the length (m) and the cross-sectional area A (m$^2$) of electrodes 22A to 22D may differ between in the first heating region 1A and in the second heating region 1B. Similarly, one or both of the length (m) and the cross-sectional area A (m$^2$) of the terminals 21A to 21D may differ between in the first heating region 1A and in the second heating region 1B.

This can make the resistance value of the first heating region 1A different from the resistance value of the second heating region 1B, thereby positively biasing the thermal environment in the furnace.

In the above exemplary embodiments, in each of the heat generation portions 11, 71 and 82, the upper slits 31 are equal to each other in width and a cutout depth extending downward from the upper end, and the lower slits 32 are also equal to each other in width and a cutout depth extending upward from the lower end. However, the width and the cutout depth of each upper slit 31 and each lower slit 32 are not limited thereto. For instance, the width and the cutout depth of each upper slit 31 and each lower slit 32 may differ between in the first heating region and in the second heating region. Similarly, the cutout depth of each upper slit 31 and each lower slit 32 of the heat generation portion 62 may differ between in the first heating region and in the second heating region.

This can make the resistance value of the first heating region different from the resistance value of the second heating region, thereby positively biasing the thermal environment in the furnace.

In the above exemplary embodiments, an exemplary arrangement of the power supply portions 12A to 12D symmetrical with respect to the virtual plane VS is shown. However, the arrangement of the power supply portions 12A to 12D is not limited thereto. For instance, the power supply portions 12A to 12D may be arranged in a manner to form an angle of about 30 degrees on the right side or the left side with respect to the virtual plane VS. In this case, it is only required that the heat generation amount of the first heating region is made different from the heat generation amount of the second heating region in a manner to be sufficient for the convection pattern to be controllable by adjusting the resistance value of each of the power supply portions 12A to 12D. However, the power supply portions 12A to 12D are preferably arranged at symmetrical positions with respect to the virtual plane VS, because this symmetrical arrangement makes a region affected by adjusting the resistance value wide, thereby easily adjusting the heat generation amount.

In addition, technologies described in the above exemplary embodiments can be mutually applied unless there is a particular contradiction or problem in the purpose, configuration, or the like. For instance, the total number of the electrical resistance adjuster 24 described in the first exemplary embodiment may be made different between in the first heating region and in the second heating region, and simultaneously, the fastening forces of the fasteners 23A to 23D described in the second exemplary embodiment may be made different between in the first heating region and in the second heating region.

EXAMPLES

Next, Examples of the invention will be described. It should be noted that the invention is by no means limited to Examples.

Using the heating portion depicted in the equivalent circuit diagram of FIG. 5, ten pieces of monocrystalline silicon for each Experimental Example were pulled up and convection control probability, convection controllability and crystal growth were judged.

For the heating portion having four power supply portions 12A to 12D, as shown in FIG. 5, the terminals 21A to 21D were connected to the respective electrodes 22A to 22D in a manner that the opposing terminals 21A and 21C were perpendicular to and the opposing terminals 21B and 21D were parallel to the application direction of the horizontal magnetic field.

Experimental Example 1

In Experimental Example 1, the first to fourth curve portions between four terminals 21A to 21D were formed of the same material into the same shape. The resistance values RA to RD of the respective first to fourth curve portions were actually measured and were all confirmed to be 41 mΩ. Three electrical resistance adjusters 24 were interposed between each of the terminals 21A to 21D and the corresponding one of the electrodes 22A to 22D. By adjusting the fastening forces of the fasteners 23A to 23D, the contact resistance values R1 to R4 of the respective four power supply portions 12A to 12D were all adjusted to 1 mΩ. The resistance value and the heat generation amount ratio in Experimental Example 1 are shown in Table 1.

Experimental Examples 2 to 6

A target in Experimental Examples 2 to 6 was to intentionally bias the Joule heat generation amounts W of the curve portions in the direction perpendicular to the horizontal magnetic field between in the first heating region and the second heating region. The resistance values of the first to fourth curve portions were changed by making cross-sectional areas of the first to fourth curve portions the same and adjusting the total number of the upper slits and the lower slits in the first to fourth curve portions. The contact resistance values R1 to R4 of the respective four power supply portions 12A to 12D are the same as those in Experimental Example 1.

Firstly, based on the equivalent circuit diagram shown in FIG. 5, the Joule heat generation amounts $W_A$, $W_B$, $W_C$ and $W_D$ of the respective first to fourth curve portions were calculated in accordance with Ohm's law. Next, the resistance values RB and RC of the respective second and third curve portions were calculated so as to make a heat generation amount ratio $(W_B+W_C)/(W_A+W_D)$ a predetermined value, in which the heat generation amount ratio $(W_B+W_C)/(W_A+W_D)$ was obtained by dividing a sum of the Joule heat generation amounts $W_B$ and $W_C$ $(W_B+W_C)$ of the respective second and third curve portions with a sum of the Joule heat generation amounts $W_A$ and $W_D$ $(W_A+W_D)$ of the first and fourth curve portions. The total number of the upper slits and the lower slits of each of the first to fourth curve portions was adjusted so as to reach the predetermined value of the heat generation amount ratio $(W_B+W_C)/(W_A+W_D)$. For instance, in Experimental Example 2, the resistance values RB and RC were adjusted to 33.5 mΩ so that the heat generation amount ratio was 1.2. The resistance value and the heat generation amount ratio in Experimental Examples 2 to 6 are shown in Table 1.

Experimental Examples 7 to 11

In Experimental Examples 7 to 11, the same heating portion as in Experimental Example 1 was used. In Experimental Examples 7 to 11, based on the same target as in Experimental Examples 2 to 6, the contact resistance values R1 to R4 of the respective four power supply portions 12A to 12D were adjusted by adjusting the total number of the electrical resistance adjuster 24 and the fastening forces of the fasteners 23A to 23D.

Firstly, based on the equivalent circuit diagram shown in FIG. 5, the Joule heat generation amounts $W_A$ to $W_D$ of the respective first to fourth curve portions were calculated in accordance with Ohm's law. Next, the contact resistance value R1 was calculated so as to make the heat generation amount ratio $(W_B+W_C)/(W_A+W_D)$ a predetermined value, and actually adjusted.

Specifically, probes were connected to a total of eight positions, namely, four positions of the heat generation portion 11 (e.g., near the terminals 21A to 21D) and four positions of the electrodes 22A to 22D (e.g., near the upper ends 22AA to 22DA), and combined resistance was measured according to a four-terminal method. All the contact resistance values R1 to R4 and the resistance values RA to RD were obtained by solving the resulting simultaneous equations for the contact resistance values R1 to R4 and the resistance values RA to RD.

Next, based on the obtained contact resistance values R1 to R4 and resistance values RA to RD, the Joule heat generation amounts $W_A$ to $W_D$ were obtained, and then the contact resistance value R1 was calculated so as to make the heat generation amount ratio $(W_B+W_C)/(W_A+W_D)$ a predetermined value.

Next, while measuring the contact resistance value R1, the fastening force of the fastener 23A was adjusted so that the contact resistance value R1 became the target value.

For instance, in Experimental Example 7, the contact resistance value R1 was adjusted to 3.1 mΩ so that the heat generation amount ratio was 1.2. The resistance value and the heat generation amount ratio in Experimental Examples 7 to 11 are shown in Table 1.

TABLE 1

| | RD(mΩ) | RA(mΩ) | RB(mΩ) | RC(mΩ) | R1(mΩ) | R2(mΩ) | R3(mΩ) | R4(mΩ) | Heat Generation Amount Ratio |
|---|---|---|---|---|---|---|---|---|---|
| Experimental Example 1 | 41 | 41 | 41 | 41 | 1 | 1 | 1 | 1 | 1.0 |
| Experimental Example 2 | 41 | 41 | 33.5 | 33.5 | 1 | 1 | 1 | 1 | 1.2 |
| Experimental Example 3 | 41 | 41 | 30.5 | 30.5 | 1 | 1 | 1 | 1 | 1.3 |
| Experimental Example 4 | 41 | 41 | 28 | 28 | 1 | 1 | 1 | 1 | 1.4 |
| Experimental Example 5 | 41 | 41 | 26 | 26 | 1 | 1 | 1 | 1 | 1.5 |
| Experimental Example 6 | 41 | 41 | 24 | 24 | 1 | 1 | 1 | 1 | 1.6 |
| Experimental Example 7 | 41 | 41 | 41 | 41 | 3.1 | 1 | 1 | 1 | 1.2 |
| Experimental Example 8 | 41 | 41 | 41 | 41 | 4 | 1 | 1 | 1 | 1.3 |
| Experimental Example 9 | 41 | 41 | 41 | 41 | 4.9 | 1 | 1 | 1 | 1.4 |

TABLE 1-continued

| | RD(mΩ) | RA(mΩ) | RB(mΩ) | RC(mΩ) | R1(mΩ) | R2(mΩ) | R3(mΩ) | R4(mΩ) | Heat Generation Amount Ratio |
|---|---|---|---|---|---|---|---|---|---|
| Experimental Example 10 | 41 | 41 | 41 | 41 | 5.8 | 1 | 1 | 1 | 1.5 |
| Experimental Example 11 | 41 | 41 | 41 | 41 | 6.7 | 1 | 1 | 1 | 1.6 |

In each of Experimental Examples 1 to 11, ten pieces of monocrystalline silicon were pulled up and convection control probability, convection controllability and crystal growth were judged. Table 2 shows the results. In Table 2, a case where a variation in diameter in the pull-up direction of monocrystalline silicon is 1 mm or more is determined as "C", a case where the variation in diameter is 0.5 mm or more and less than 1 mm is determined as "B", and a case where the variation in diameter is less than 0.5 mm is determined as "A".

TABLE 2

| | Convection Control Probability (%) | Convection Controllability | Crystal Growth | Overall Judgment |
|---|---|---|---|---|
| Experimental Example 1 | 50 | C | A | C |
| Experimental Example 2 | 60 | B | A | B |
| Experimental Example 3 | 100 | A | A | A |
| Experimental Example 4 | 100 | A | A | A |
| Experimental Example 5 | 100 | A | A | A |
| Experimental Example 6 | 100 | A | C | C |
| Experimental Example 7 | 60 | B | A | B |
| Experimental Example 8 | 100 | A | A | A |
| Experimental Example 9 | 100 | A | A | A |
| Experimental Example 10 | 100 | A | A | A |
| Experimental Example 11 | 100 | A | C | C |

Evaluation

The results of Experimental Examples 1 to 6 shown in Table 2 reveal that increasing the heat generation amount ratio by directly changing the resistance values of the first to fourth curve portions forming the heat generation portion increases convection control probability but decreases crystal growth. Accordingly, adjusting the resistance values of the first to fourth curve portions so as to obtain an appropriate heat generation amount ratio can provide a furnace having superior overall judgment. Especially, by setting the heat generation amount ratio to 1.2 or more, the convection controllability is improvable. Further, by setting the heat generation amount ratio in a range from 1.3 to 1.5, a variation in the oxygen concentration of monocrystalline silicon pulled up by controlling the convection is suppressible and a venation in the diameter of the monocrystalline silicon is suppressible, whereby productivity of high-quality monocrystalline silicon is improvable.

The results of Experimental Examples 7 to 11 shown in Table 2 reveal that even when the heating portion having the same shape is used, the similar effects to those in Experimental Examples 2 to 6 are obtained by adjusting the contact resistance value through calculation. A method of adjusting the contact resistance value does not require the heating portion to be processed and makes it possible to adjust the contact resistance value at a working site, which is extremely useful.

The invention claimed is:

1. A heating portion of monocrystalline silicon manufacturing equipment, the heating portion disposed outside and surrounding a quartz crucible and configured to heat a silicon melt in the quartz crucible, the heating portion comprising:

a heat generation portion integrally molded into a cylinder; and 2n pieces, n being an integer of 2 or more, of power supply portions configured to supply electric power to the heat generation portion, wherein when the heating portion is divided by a virtual plane into two comprising a first heating region located on one side of the heat generation portion with respect to the virtual plane and a second heating region located on the other side of the heat generation portion with respect to the virtual plane, the virtual plane passing through a center axis of the heat generation portion, being perpendicular to the heat generation portion, and being parallel to a central magnetic field line of a horizontal magnetic field applied to the silicon melt, a heat generation amount of the first heating region and a heat generation amount of the second heating region are set to different values by setting a first resistance value and a second resistance value to different values, the first resistance value being a sum of resistance values of the heat generation portion and all the power supply portions provided in the first heating region, the second resistance value being a sum of resistance values of the heat generation portion and all the power supply portions provided in the second heating region, the power supply portions each comprise: a terminal connected to the heat generation portion; and an electrode having one end directly connected to the terminal and the other end connected to a power source, a plate-shaped electrical resistance adjuster is interposed between the terminal and the electrode, and the first resistance value and the second resistance value are set to different values by making a total number of the electrical resistance adjuster interposed in the first heating region differ from a total number of the electrical resistance adjuster interposed in the second heating region.

2. The heating portion of monocrystalline silicon manufacturing equipment according to claim 1, wherein the power supply portions each comprise: a terminal connected to the heat generation portion, and the terminal is integrally molded with the heat generation portion.

3. The heating portion of monocrystalline silicon manufacturing equipment according to claim 1, wherein the heat generation portion has a uniform thickness in a circumferential direction.

4. The heating portion of monocrystalline silicon manufacturing equipment according to claim 1, wherein the power supply portions are arranged at positions facing each other across the quartz crucible and being orthogonal to the virtual plane.

5. A heating portion of monocrystalline silicon manufacturing equipment, the heating portion disposed outside and surrounding a quartz crucible and configured to heat a silicon melt in the quartz crucible, the heating portion comprising:

a heat generation portion integrally molded into a cylinder; and 2n pieces, n being an integer of 2 or more, of power supply portions configured to supply electric power to the heat generation portion, wherein when the heating portion is divided by a virtual plane into two comprising a first heating region located on one side of the heat generation portion with respect to the virtual plane and a second heating region located on the other side of the heat generation portion with respect to the virtual plane, the virtual plane passing through a center axis of the heat generation portion, being perpendicular to the heat generation portion, and being parallel to a central magnetic field line of a horizontal magnetic field applied to the silicon melt, a heat generation amount of the first heating region and a heat generation amount of the second heating region are set to different values by setting a first resistance value and a second resistance value to different values, the first resistance value being a sum of resistance values of the heat generation portion and all the power supply portions provided in the first heating region, the second resistance value being a sum of resistance values of the heat generation portion and all the power supply portions provided in the second heating region, the power supply portions each comprise: a terminal connected to the heat generation portion; an electrode having one end directly connected to the terminal and the other end connected to a power source, and a fastener fastening the terminal and the electrode, and the first resistance value and the second resistance value are set to different values by making fastening force of the fastener applied in the first heating region differ from fastening force of the fastener applied in the second heating region.

6. The heating portion of monocrystalline silicon manufacturing equipment according to claim 5, further comprising:

a resistance adjustment section attached to the terminal or the electrode and configured to adjust the first resistance value and the second resistance value by making the fastening force of the fastener applied in the first heating region differ from the fastening force of the fastener applied in the second heating region.

7. A heating portion of monocrystalline silicon manufacturing equipment, the heating portion disposed outside and surrounding a quartz crucible and configured to heat a silicon melt in the quartz crucible, the heating portion comprising:

a heat generation portion integrally molded into a cylinder; and 2n pieces, n being an integer of 2 or more, of power supply portions configured to supply electric power to the heat generation portion, wherein when the heating portion is divided by a virtual plane into two comprising a first heating region located on one side of the heat generation portion with respect to the virtual plane and a second heating region located on the other side of the heat generation portion with respect to the virtual plane, the virtual plane passing through a center axis of the heat generation portion, being perpendicular to the heat generation portion, and being parallel to a central magnetic field line of a horizontal magnetic field applied to the silicon melt, a heat generation amount of the first heating region and a heat generation amount of the second heating region are set to different values by setting a first resistance value and a second resistance value to different values, the first resistance value being a sum of resistance values of the heat generation portion and all the power supply portions provided in the first heating region, the second resistance value being a sum of resistance values of the heat generation portion and all the power supply portions provided in the second heating region, the power supply portions each comprise: a terminal connected to the heat generation portion, and an electrode having one end directly connected to the terminal and the other end connected to a power source, the heat generation portion and the terminal are bonded to each other through an adhesive layer, and the first resistance value and the second resistance value are set to different values by making a material or a thickness of the adhesive layer used in the power supply portion provided in the first heating region differ from a material or a thickness of the adhesive layer used in the power supply portion provided in the second heating region.

\* \* \* \* \*